(12) United States Patent
Yamaguchi

(10) Patent No.: US 9,935,235 B2
(45) Date of Patent: Apr. 3, 2018

(54) METHOD FOR MANUFACTURING A SEMICONDUCTOR DEVICE

(71) Applicant: Renesas Electronics Corporation, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/469,454

(22) Filed: Mar. 24, 2017

(65) Prior Publication Data

US 2017/0317226 A1  Nov. 2, 2017

(30) Foreign Application Priority Data

May 2, 2016  (JP) ................... 2016-092276

(51) Int. Cl.
| | |
|---|---|
| *H01L 21/00* | (2006.01) |
| *H01L 31/18* | (2006.01) |
| *H01L 31/109* | (2006.01) |
| *H01L 31/103* | (2006.01) |
| *H01L 31/0224* | (2006.01) |

(52) U.S. Cl.
CPC .. *H01L 31/1864* (2013.01); *H01L 31/022408* (2013.01); *H01L 31/103* (2013.01); *H01L 31/109* (2013.01); *H01L 31/186* (2013.01)

(58) Field of Classification Search
CPC ...................................................... H01L 21/00
See application file for complete search history.

(56) References Cited

U.S. PATENT DOCUMENTS

| | | | |
|---|---|---|---|
| 8,018,012 | B2 | 9/2011 | Nakagawa et al. |
| 8,138,532 | B2 | 3/2012 | Tomomatsu et al. |
| 2009/0078974 | A1 | 3/2009 | Nagai et al. |
| 2016/0181311 | A1 | 6/2016 | Kadono et al. |
| 2016/0351393 | A1 | 12/2016 | Iwanaga et al. |

FOREIGN PATENT DOCUMENTS

| | | |
|---|---|---|
| JP | 2007-081205 A | 3/2007 |
| JP | 2009-059824 A | 3/2009 |
| JP | 2009-295918 A | 12/2009 |
| JP | 2010-034181 A | 2/2010 |
| JP | 2014-099481 A | 5/2014 |
| JP | 2014-099482 A | 5/2014 |
| JP | 2015-130396 A | 7/2015 |
| JP | 2015-130397 A | 7/2015 |

*Primary Examiner* — Marvin Payen
(74) *Attorney, Agent, or Firm* — McGinn IP Law Group, PLLC

(57) ABSTRACT

The performances of a semiconductor device are improved. A method for manufacturing a semiconductor device includes the steps of: providing a semiconductor substrate having a gettering layer formed by ion implanting a cluster, and an epitaxial layer; subjecting the semiconductor substrate to a heat treatment at 800° C. or more, and thereby forming a hydrogen adsorption site; forming an element isolation film at the semiconductor substrate, to be performed thereafter; implanting an impurity for forming a first semiconductor region in the semiconductor substrate; implanting an impurity for forming a second semiconductor region; and performing a heat treatment for a photodiode, to be performed thereafter.

15 Claims, 28 Drawing Sheets

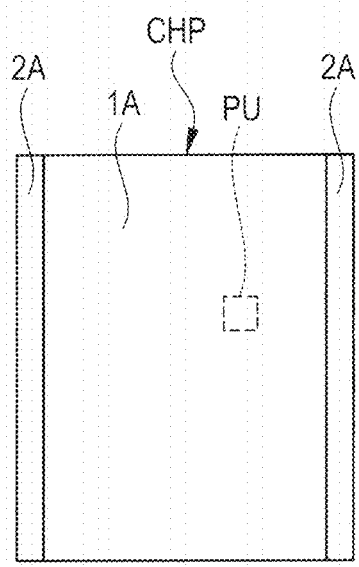
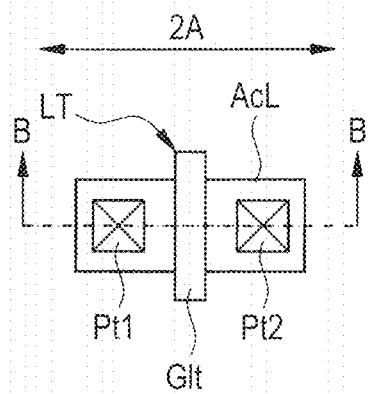

METHOD FOR MANUFACTURING A SEMICONDUCTOR DEVICE

CROSS-REFERENCE TO RELATED APPLICATIONS

The disclosure of Japanese Patent Application No. 2016-092276 filed on May 2, 2016 including the specification, drawings and abstract is incorporated herein by reference in its entirety.

BACKGROUND

The present invention relates to a method for manufacturing a semiconductor device, and is preferably used for a method for manufacturing a semiconductor device including, for example, a solid-state image sensing element.

As a solid-state image sensing element, a solid-state image sensing element (CMOS image sensor) using a CMOS (Complementary Metal Oxide Semiconductor) has been under development. The CMOS image sensor includes a plurality of pixels each having a photodiode and a transfer transistor.

With a CMOS image sensor, a technology of providing a gettering layer in a semiconductor substrate is known as a countermeasure against dark-time white spots, and a technology referred to as "hydrogen sintering)" of terminating the dangling bond by hydrogen is known as a countermeasure against dark-time white spots or dark current.

Japanese Unexamined Patent Application Publication No. 2015-130397 (Patent Document 1), Japanese Unexamined Patent Application Publication No. 2015-130396 (Patent Document 2), Japanese Unexamined Patent Application Publication No. 2014-99482 (Patent Document 3), and Japanese Unexamined Patent Application Publication No. 2014-99481 (Patent Document 4) each disclose a technology of forming a gettering layer in a silicon substrate by cluster ion irradiation in a silicon epitaxial wafer having an epitaxial layer over a silicon substrate.

Japanese Unexamined Patent Application Publication No. 2010-34181 (Patent Document 5), Japanese Unexamined Patent Application Publication No. 2009-295918 (Patent Document 6), Japanese Unexamined Patent Application Publication No. 2009-59824 (Patent Document 7), and Japanese Unexamined Patent Application Publication No. 2007-81205 (Patent Document 8) each disclose a hydrogen sintering technology.

PATENT DOCUMENTS

[Patent Document 1] Japanese Unexamined Patent Application Publication No. 2015-130397
[Patent Document 2] Japanese Unexamined Patent Application Publication No. 2015-130396
[Patent Document 3] Japanese Unexamined Patent Application Publication No. 2014-99482
[Patent Document 4] Japanese Unexamined Patent Application Publication No. 2014-99481
[Patent Document 5] Japanese Unexamined Patent Application Publication No. 2010-34181
[Patent Document 6] Japanese Unexamined Patent Application Publication No. 2009-295918
[Patent Document 7] Japanese Unexamined Patent Application Publication No. 2009-59824
[Patent Document 8] Japanese Unexamined Patent Application Publication No. 2007-81205

SUMMARY

The present inventors have conducted a study on use of a silicon epitaxial wafer having the gettering layer, and a hydrogen sintering treatment in the development of a CMOS image sensor.

In general, a hydrogen sintering treatment is carried out at temperatures of, for example, around 400° C. after forming elements such as a photodiode and a transferring transistor, and wires over the elements in a silicon epitaxial wafer. It is difficult to set the temperature of hydrogen sintering at a temperature equivalent to or higher than the temperature in view of the characteristics variation of the elements, or the heat resistance of the wire formed of aluminum, copper, or the like.

However, the following problem has become clear: at temperatures of around 400° C., the dangling bonds at the interface between silicon and the oxide film cannot be terminated sufficiently; this causes a leakage current due to the interface level, which makes it impossible to improve the device characteristics such as dark-time white spots or dark current.

With a semiconductor device having a photodiode, the reduction of dark-time white spots, dark current, or the like, namely, the improvement of performances of the semiconductor device has been desired.

Other objects and novel features will be apparent from the description of this specification and the accompanying drawings.

In accordance with one embodiment, with a method for manufacturing a semiconductor device, manufacturing steps of a semiconductor device are carried out, which include: providing a semiconductor substrate having a gettering layer formed by ion implanting a cluster in the inside thereof, and an epitaxial layer formed at the top of the gettering layer; subjecting the semiconductor substrate to a heat treatment at 800° C. or more, thereby to form a hydrogen adsorption site, followed by a heat treatment at 600° C. or more.

In accordance with another embodiment, the performances of a semiconductor device can be improved.

BRIEF DESCRIPTION OF THE DRAWINGS

FIG. 4 is a plan view showing a chip region for forming the semiconductor device of First Embodiment therein;

FIG. 5 is a plan view showing a transistor to be formed in a peripheral circuit region of the semiconductor device of First Embodiment;

DETAILED DESCRIPTION

In description of the following embodiment, the embodiment may be described in a plurality of divided sections or embodiments for convenience, if required. However, unless otherwise specified, these are not independent of each other, but are in a relation such that one is a modification example, a detailed description, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, or except for other cases. Further, in the following embodiments, it is naturally understood that the constitutional elements (including element steps, or the like) are not always essential, unless otherwise specified, except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, or except for other cases. This also applies to the foregoing numerical values and ranges.

Below, embodiments will be described in details by reference to the accompanying drawings. Incidentally, in all the drawings for describing the embodiments, the members having the same function are given the same reference sign and numeral, and a repeated description thereon is omitted. Further, in the following embodiments, a description on the same or similar part will not be repeated in principle, unless otherwise required.

Further, in the accompanying drawings used in embodiments, hatching may be omitted even in a cross sectional view for ease of understanding of the drawings. Whereas, hatching may be added even in a plan view for ease of understanding of the drawings.

First Embodiment

Below, referring to the accompanying drawings, the structure and the manufacturing steps of a semiconductor device of First Embodiment will be described in details. In the present First Embodiment, a description will be given to an example of a CMOS image sensor as a front surface irradiation type image sensor that receives a light from the front surface side of the semiconductor substrate.

Configuration of Semiconductor Device

Figure 1:
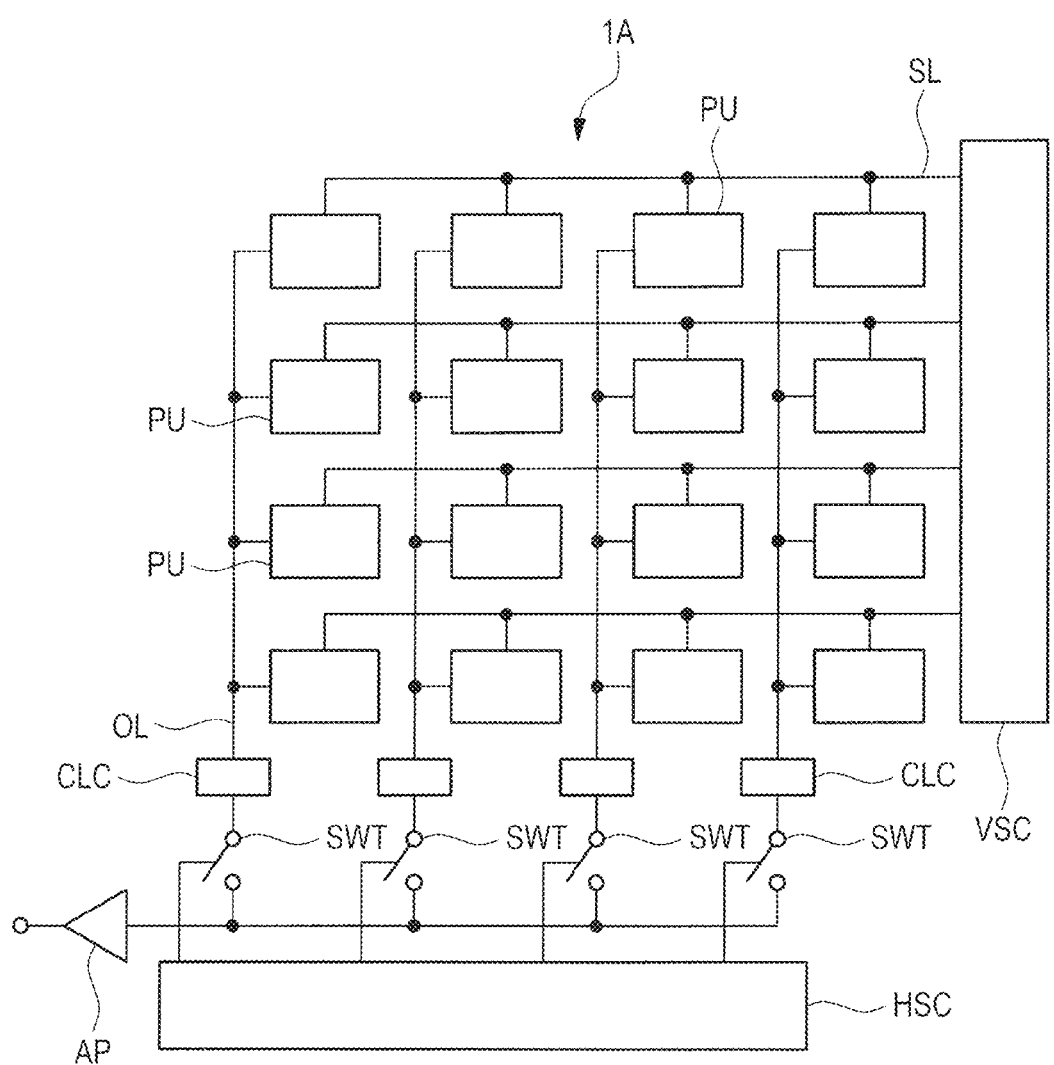
FIG. 1 is a circuit block diagram showing a configuration example of a semiconductor device of First Embodiment.
Figure 2:
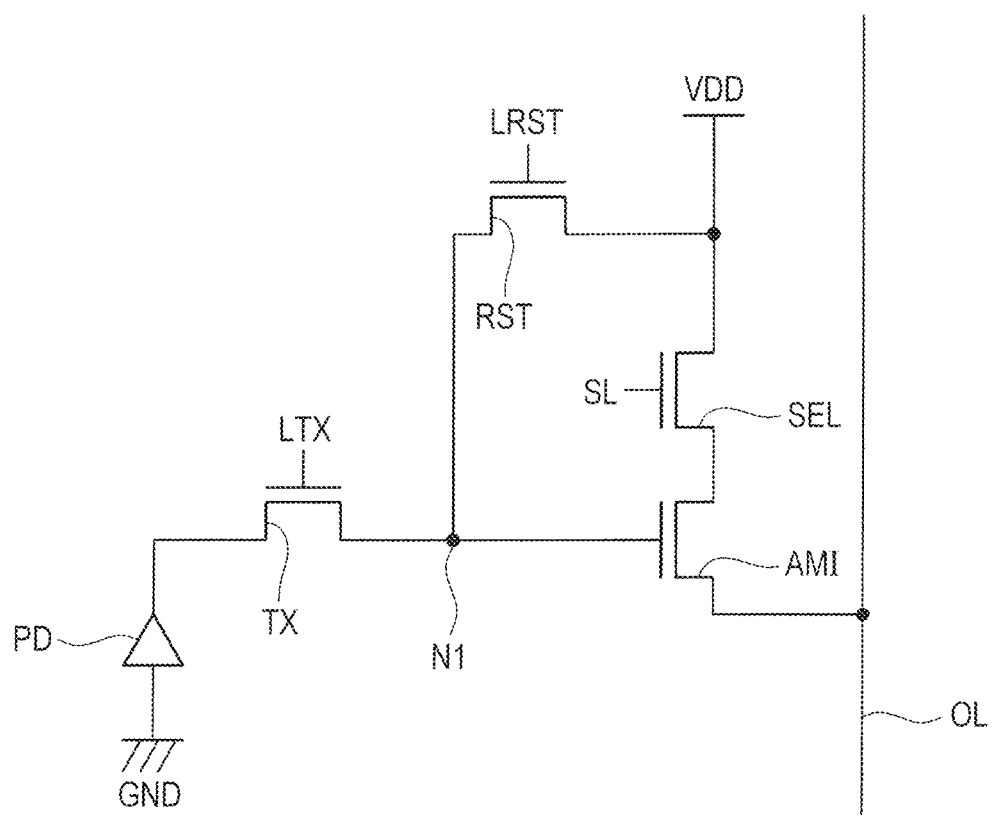
FIG. 2 is a circuit diagram showing a configuration example of a pixel.

FIG. 1 is a circuit block diagram showing a configuration example of a semiconductor device of the present embodiment. FIG. 2 is a circuit diagram showing a configuration example of a pixel. Incidentally, FIG. 1 shows 16 pixels arranged in an array of 4 rows and 4 columns (4×4). The numbers of rows and columns are not limited thereto, and can be variously changed. For example, the number of pixels to be actually used in an electronic device such as a camera may be several millions.

In a pixel region 1A shown in FIG. 1, a plurality of pixels PU are arranged in an array. In the periphery thereof, driving circuits such as a vertical scanning circuit VSC and a horizontal scanning circuit HSC are arranged. Respective pixels (cells or pixel units) PU are arranged at points of intersection of selection lines SL and output lines OL, respectively. The selection lines SL are coupled with the vertical scanning circuit VSC, and the output lines OL are coupled with column circuits CLC, respectively. The column circuits CLC are coupled with an output amplifier AP via switches SWT, respectively. Respective switches SWT are coupled with the horizontal scanning circuit HSC, and are controlled by the horizontal scanning circuit HSC.

For example, an electrical signal read from the pixel PU selected by the vertical scanning circuit VSC and the horizontal scanning circuit HSC is outputted via the output line OL and the output amplifier AP.

The pixel PU includes, for example, as shown in FIG. 2, a photodiode PD and four transistors RST, TX, SEL, and AMI. The transistors RST, TX, SEL, and AMI are each formed of an n channel type MISFET (Metal Insulator Semiconductor Field Effect Transistor). Of these, the transistor RST is a reset transistor (resetting transistor), the transistor TX is a transfer transistor (transferring transistor), the transistor SEL is a selection transistor (selecting transistor), and the transistor AMI is an amplification transistor (amplifying transistor). Incidentally, the transfer transistor TX is a transferring transistor for transferring electrical charges generated by the photodiode PD. Alternatively, other than these transistors, elements such as other transistors or capacitive elements may be incorporated. Further, the coupling forms of the transistors include various changed/modified examples.

In the circuit example shown in FIG. 2, the photodiode PD and the transfer transistor TX are coupled in series between the ground potential GND and a node N1. The reset transistor RST is coupled between the node N1 and a power supply potential (power supply potential line) VDD. The selection transistor SEL and the amplification transistor AMI are coupled in series between the power supply potential VDD and the output line OL. The gate electrode of the amplification transistor AMI is coupled with the node N1. Whereas, the gate electrode of the reset transistor RST is coupled with a reset line LRST. Further, the gate electrode of the selection transistor SEL is coupled with the selection line SL, and the gate electrode of the transfer transistor TX is coupled with a transfer line (second selection line) LTX.

For example, the transfer line LTX and the reset line LRST are raised (set at a H level), so that the transfer transistor TX and the reset transistor RST are put in an ON state. As a result, the electrical charges in the photodiode PD are extracted, and depleted. Then, the transfer transistor TX is rendered in an OFF state.

Thereafter, the mechanical shutter of an electronic device such as a camera is opened. Then, during the period in which the shutter is opened, in the photodiode PD, electrical charges are generated by an incident light, and are accumulated. In other words, the photodiode PD receives an incident light, and generates electrical charges.

Then, after closing the shutter, the reset line LRST is lowered (set at a L level), so that the reset transistor RST is rendered in an OFF state. Further, the selection line SL and the transfer line LTX are raised (set at a H level), so that the selection transistor SEL and the transfer transistor TX are rendered in an ON state. As a result, the electrical charges generated by the photodiode PD are transferred to the end on the node N1 side of the transfer transistor TX (corresponding to a floating diffusion FD in FIG. 3 described later). At this step, the electrical potential of the floating diffusion FD changes into a value corresponding to the electrical charges transferred from the photodiode PD. The value is amplified by the amplification transistor AMI, and appears at the output line OL. The electrical potential of the output line OL serves as an electrical signal (light receiving signal), and is read as an output signal from the output amplifier AP via the column circuit CLC and the switch SWT.

Figure 3:
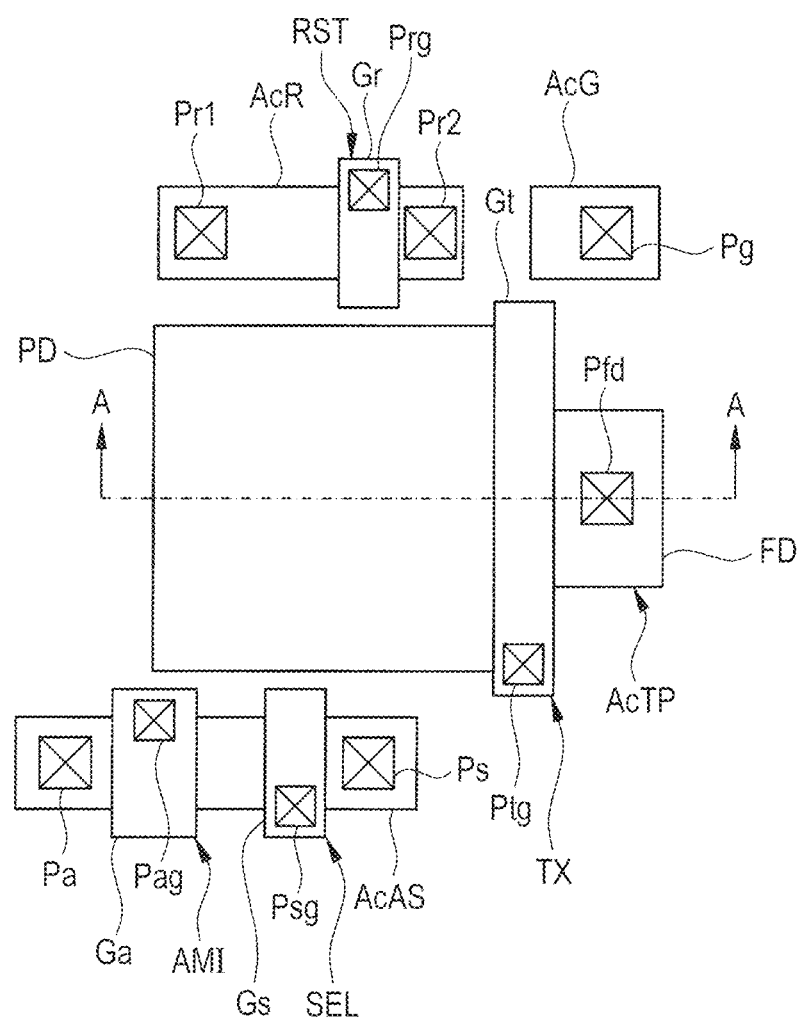
FIG. 3 is a plan view showing the pixel of the semiconductor device of First Embodiment.

FIG. 3 is a plan view showing the pixels of the semiconductor device of the present embodiment.

As shown in FIG. 3, the pixel PU (see FIG. 1) of the semiconductor device of the present embodiment has an active region AcTP in which the photodiode PD and the transfer transistor TX are arranged, and an active region AcR in which the reset transistor RST is arranged. Further, the pixel PU has an active region AcAS in which the selection transistor SEL and the amplification transistor AMI are arranged, and an active region AcG in which a plug electrode Pg coupled with a grounding potential line not shown is arranged.

In the active region AcR, a gate electrode Gr is arranged, and plug electrodes Pr1 and Pr2 are arranged over the source/drain regions on the opposite sides thereof, respectively. The gate electrode Gr and the source/drain regions form the reset transistor RST.

In the active region AcTP, a gate electrode Gt is arranged. In a plan view, the photodiode PD is arranged on one side of the opposite sides of the gate electrode Gt, and the floating diffusion FD is arranged on the other side thereof. The photodiode PD is a PN junction diode, and is formed of, for example, a plurality of n type or p type impurity diffusion regions (semiconductor regions). Whereas, the floating diffusion FD has a function as an electrical charge accumulation part or a floating diffusion layer, and is formed of, for example, an n type impurity diffusion region (semiconductor region). A plug electrode Pfd is arranged over the floating diffusion FD.

In an active region AcAS, a gate electrode Ga and a gate electrode Gs are arranged. A plug electrode Pa is arranged at the end on the gate electrode Ga side of the active region AcAS, and a plug electrode Ps is arranged at the end on the gate electrode Gs side of the active region AcAS. The opposite sides of the gate electrode Ga and the gate electrode Gs are source/drain regions. The gate electrode Ga and the gate electrode Gs, and the source/drain regions form the selection transistor SEL and the amplification transistor AMI coupled in series.

A plug Pg is arranged at the top of the active region AcG. The plug electrode Pg is coupled with a grounding potential line not shown. Accordingly, the active region AcG is a feeding region for applying a grounding potential GND to the well region of the semiconductor substrate.

Whereas, over the gate electrode Gr, the gate electrode Gt, the gate electrode Ga, and the gate electrode Gs, a plug electrode Prg, a plug electrode Ptg, a plug electrode Pag, and a plug electrode Psg are arranged, respectively.

The plug electrodes Pr1, Prg, Pg, Pfd, Pa, Ps, Prg, Ptg, Pag, and Psg are coupled by a plurality of wiring layers (e.g., wires M1 to M3 shown in FIG. 6 described later), if required. As a result, the circuits shown in FIGS. 1 and 2 can be formed.

FIG. 4 is a plan view showing the chip region for forming the semiconductor device of the present embodiment therein. The chip region CHP has the pixel region 1A, and a peripheral circuit region 2A. In the pixel region 1A, a plurality of pixels PU are arranged in a matrix. In the peripheral circuit region 2A, a logic circuit is arranged. The logic circuit calculates the output signals outputted from, for example, the pixel region 1A. Image data is outputted based on the calculation result. Further, the column circuits CLC, the switches SWT, the horizontal scanning circuit HSC, the vertical scanning circuit VSC, the output amplifier AP, and the like are also arranged in the peripheral circuit region 2A.

FIG. 5 is a plan view showing the transistor to be formed in the peripheral circuit region 2A of the semiconductor device of the present embodiment.

As shown in FIG. 5, in the peripheral circuit region 2A, a peripheral transistor LT as a logic transistor is arranged. In actuality, in the peripheral circuit region 2A, a plurality of n channel type MISFETs and a plurality of p channel type MISFETs are formed as transistors forming the logic circuit. However, FIG. 5 shows one n channel type MISFET of the transistors forming the logic circuit as the peripheral transistor LT.

As shown in FIG. 5, in the peripheral circuit region 2A, an active region AcL is formed. In the active region AcL, the gate electrode Glt of the peripheral transistor LT is arranged. On the opposite sides of the gate electrode Glt, and inside the active region AcL, the source/drain regions of the peripheral transistor LT including an n$^+$ type semiconductor region SD described later are formed. Further, over the source/drain regions of the peripheral transistor LT, plug electrodes Pt1 and Pt2 are arranged.

In FIG. 5, only one peripheral transistor LT is shown. However, in actuality, in the peripheral circuit region 2A, a plurality of transistors are arranged. The plug electrodes over the source/drain regions, or the plug electrodes over the gate electrode Glt of the plurality of transistors are coupled by a plurality of wiring layers (the wires M1 to M3 described later). As a result, a logic circuit can be formed. Further, other elements than MISFETs, such as capacitive elements or other constitutional transistors may be incorporated into the logic circuit.

Incidentally, below, a description will be given to an example in which the peripheral transistor LT is an n channel type MISFET. However, the peripheral transistor LT may be a p channel type MISFET.

Element Structure of Pixel Region and Peripheral Circuit Region

Figure 6:
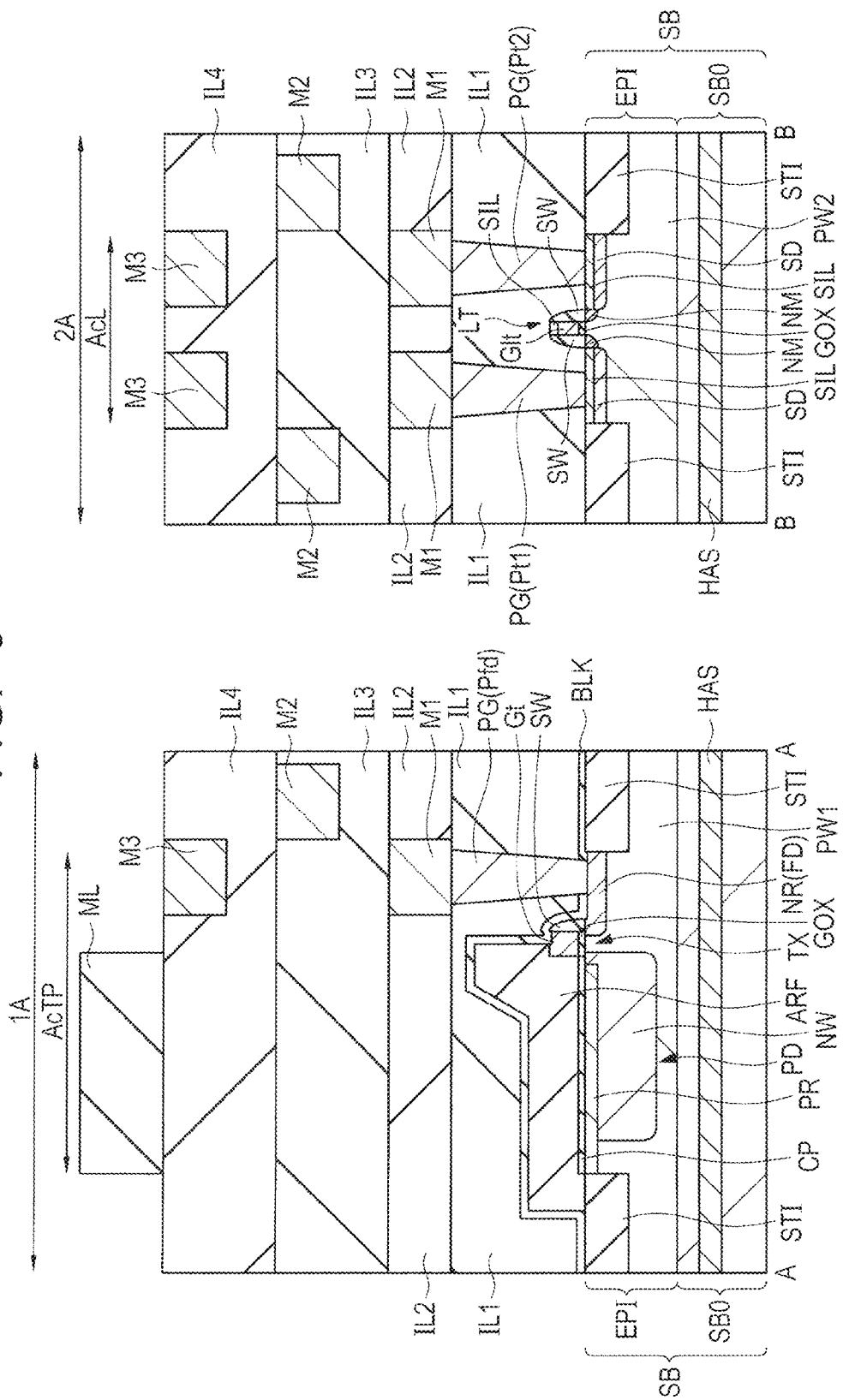
FIG. 6 is an essential part cross sectional view of the semiconductor device of First Embodiment.

Then, with reference to the cross sectional view (FIG. 6) of the semiconductor device of the present embodiment, the structure of the semiconductor device of the present embodiment will be described. FIG. 6 is an essential part cross sectional view of the semiconductor device of the present embodiment. The left part of FIG. 6 corresponds to the pixel region 1A, and is a cross sectional view along line A-A of FIG. 3. The right part of FIG. 6 corresponds to the peripheral circuit region 2A, and is a cross sectional view along line B-B of FIG. 5.

As shown in FIG. 6, in the active region AcTP in the pixel region 1A of the semiconductor substrate SB, the photodiode PD and the transfer transistor TX are formed. The photodiode PD includes a p type well region PW1, an n type semiconductor region (n type well region) NW, and a p$^+$ type semiconductor region PR formed in the semiconductor substrate SB. Whereas, in the active region AcL in the peripheral circuit region 2A of the semiconductor substrate SB, the peripheral transistor LT is formed.

The semiconductor substrate SB has a lamination structure of a semiconductor substrate (semiconductor wafer) SB0, and an epitaxial layer EPI over the semiconductor substrate SB0. The semiconductor substrate SB0 is formed of an n type single crystal silicon doped with an n type impurity (donor) such as phosphorus (P) or arsenic (As). The epitaxial layer EPI is also a single crystal silicon layer having an n type impurity (donor) such as phosphorus (P) or arsenic (As). Herein, the density relationship and the conductivity types of both are expressed in terms of semiconductor substrate SB0/epitaxial layer EPI, and then, can be expressed as n/n$^-$, p/p$^+$, n/p$^+$, or the like. Herein, the film thickness of the epitaxial layer EPI is about 10 μm, and the film thickness of the semiconductor substrate SB0 is 400 to 700 μm.

Whereas, in the semiconductor substrate SB0, a hydrogen adsorption site HAS is formed. The hydrogen adsorption site HAS has a thickness of 0.05 to 1 μm, and is formed at a depth of 4 to 10 μm from the surface of the semiconductor substrate SB0 across the entire region of the semiconductor substrate SB0 (in a plan view). It is naturally understood that the hydrogen adsorption sites HAS are formed in both of the pixel region 1A and the peripheral circuit region 2A, respectively. The hydrogen adsorption site HAS is a gettering layer for gettering a metal such as copper (Cu), iron (Fe), or nickel (Ni), and is a layer capable of adsorbing (occluding) and desorbing (eliminating) hydrogen. Although described later, the hydrogen adsorption site HAS is formed in the following manner. A cluster CxHy is ion implanted into the semiconductor substrate SB0 to form a gettering layer. The resulting gettering layer is subjected to a prescribed heat treatment.

In the periphery of the active region AcTP, an element isolation film (element isolation region) STI formed of an insulator is arranged. The exposed regions of the semiconductor substrate SB thus surrounded by the element isolation film STI serve as active regions such as the active region AcTP and the active region AcL.

At a prescribed depth through from the main surface of the semiconductor substrate SB, p type well regions (p type semiconductor regions) PW1 and PW2 are formed. The p type well region PW1 is formed across the entire active region AcTP. That is, the p type well region PW1 is formed across the region in which the photodiode PD is formed, and the region in which the transfer transistor TX is formed. Whereas, the p type well region PW2 is formed across the entire active region AcL. That is, the p type well region PW2 is formed in the region in which the peripheral transistor LT is formed. The p type well region PW1 and the p type well region PW2 are both p type semiconductor regions doped with a p type impurity such as boron (B). The p type well region PW1 and the p type well region PW2 are mutually independent regions, and are also electrically independent of each other. The p type well region PW1 and the p type well region PW2 each have a depth of about 1 to 2 μm, are thinner than the epitaxial layer EPI, and are formed at the top of the epitaxial layer EPI.

As shown in FIG. 6, in the semiconductor substrate SB in the active region AcTP, an n type semiconductor region (n type well region) NW doped with an n type impurity such as phosphorus (P) or arsenic (As) is formed in such a manner as to be internally included in the p type well region PW1.

The n type semiconductor region NW is an n type semiconductor region for forming the photodiode PD therein, and is also the source region of the transfer transistor TX. That is, then type semiconductor region NW is mainly formed in the region in which the photodiode PD is formed. However, a part of the n type semiconductor region NW is formed at such a position as to overlap the gate electrode Gt of the transfer transistor TX two dimensionally (in a plan view). (The bottom surface) of the n type semiconductor region NW is formed at a depth shallower than (the bottom surface) of the p type well region PW1.

In a part of the surface of the n type semiconductor region NW, a p$^+$ type semiconductor region PR doped with a p type impurity such as boron (B) with a high density is formed. The impurity density (p type impurity density) of the p$^+$ type semiconductor region PR is higher than the impurity density (p type impurity density) of the p type well region PW1. For this reason, the conductivity (electric conductivity) of the p$^+$ type semiconductor region PR is higher than the conductivity (electric conductivity) of the p type well region PW1.

The depth of (the bottom surface) of the p$^+$ type semiconductor region PR is shallower than the depth of (the bottom surface) of the n type semiconductor region NW. The p$^+$ type semiconductor region PR is formed mainly in the front surface layer portion (front surface portion) of the n type semiconductor region NW. For this reason, as seen in the thickness direction of the semiconductor substrate SB, the n type semiconductor region NW is present under the uppermost-layer p$^+$ type semiconductor region PR, and the p type well region PW1 is present under the n type semiconductor region NW.

Further, in the region in which the n type semiconductor region NW is not formed, a part of the p$^+$ type semiconductor region PR is in contact with the p type well region PW1. That is, the p$^+$ type semiconductor region PR has the portion immediately under which the n type semiconductor region NW is present, and which is in contact with the n type semiconductor region NW, and the portion immediately under which the p type well region PW1 is present, and which is in contact with the p type well region PW1.

A PN junction is formed between the p type well region PW1 and the n type semiconductor region NW. Whereas, a PN junction is formed between the p$^+$ type semiconductor region PR and the n type semiconductor region NW. The p type well region PW1 (p type semiconductor region), the n type semiconductor region NW, and the p$^+$ type semiconductor region PR form the photodiode (PN junction diode) PD.

The p$^+$ type semiconductor region PR is formed for the purpose of suppressing the generation of electrons based on a large number of interface levels formed at the surface of the semiconductor substrate SB. That is, in the surface region of the semiconductor substrate SB, electrons may be generated under the influence of the interface levels even with no light applied thereto, incurring an increase in dark current. For this reason, in the surface of the n type semiconductor region NW having electrons as major carriers, the p$^+$ type semiconductor region PR having holes as major carriers is formed. This suppresses the generation of electrons with no light applied thereto. As a result, it is possible to suppress an increase in dark current. Therefore, the p$^+$ type semiconductor region PR has a role of recombining the electrons flowing from the photodiode outermost surface with the holes in the p$^+$ type semiconductor region PR, and thereby reducing the dark current.

The photodiode PD is a light receptive element. Alternatively, the photodiode PD can also be regarded as a photoelectric conversion element. The photodiode PD has a function of photoelectrically converting an inputted light, generating electrical charges, and accumulating the generated electrical charges. The transfer transistor TX has a role as a switch for transferring the electrical charges accumulated in the photodiode PD from the photodiode PD.

Whereas, a gate electrode Gt is formed in such a manner as to two dimensionally overlap a part of the n type semiconductor region NW. The gate electrode Gt is the gate electrode of the transfer transistor TX, and is formed (arranged) over the semiconductor substrate SB via a gate insulation film GOX. Over the sidewall of the gate electrode Gt, a sidewall spacer SW is formed as a sidewall insulation film.

In the semiconductor substrate SB (p type well region PW1) in the active region AcTP, on one side of the opposite sides of the gate electrode Gt, the n type semiconductor region NW is formed, and on the other side thereof, the n type semiconductor region NR is formed. The n type semiconductor region NR is an n$^+$ type semiconductor region doped with an n type impurity such as phosphorus (P) or arsenic (As) with a high density, and is formed in the p type well region PW1. The n type semiconductor region NR is a semiconductor region as the floating diffusion (floating diffusion layer) FD, and is also the drain region of the transfer transistor TX.

The n type semiconductor region NR functions as the drain region of the transfer transistor TX, and can also be regarded as the floating diffusion (floating diffusion layer) FD. Whereas, the n type semiconductor region NW is a constitutional element of the photodiode PD, and can also function as the semiconductor region for the source of the transfer transistor TX. That is, the source region of the transfer transistor TX is formed by the n type semiconductor region NW. For this reason, the n type semiconductor region NW and the gate electrode Gt are preferably in a positional relationship such that a part (source side) of the gate electrode Gt overlaps a part of the n type semiconductor region NW two dimensionally (in a plan view). The n type semiconductor region NW and the n type semiconductor region NR are formed in such a manner as to be separated from each other across the channel formation region (corresponding to the substrate region immediately under the gate electrode Gt) of the transfer transistor TX.

At the surface of the photodiode PD (see FIG. 3), namely, at the surfaces of the n type semiconductor region NW and the p$^+$ type semiconductor region PR, a cap insulation film CP is formed. The cap insulation film CP is formed in order to keep the surface characteristics, namely, the interface characteristics of the semiconductor substrate SB favorable. Over the cap insulation film CP, an antireflection film ARF is formed. That is, the antireflection film ARF is formed over the n type semiconductor region NW and the p$^+$ type semiconductor region PR via the cap insulation film CP. A part (the end) of the antireflection film ARF may extend over the gate electrode Gt.

On the other hand, as shown in the right side of FIG. 6, over the p type well region PW2 in the active region AcL, the gate electrode Glt of the peripheral transistor LT is formed via the gate insulation film GOX. Over each sidewall on the opposite sides of the gate electrode Glt, a sidewall spacer SW is formed. Whereas, in the portions of the p type well region PW2 on the opposite sides of the gate electrode Glt, the source/drain regions of the peripheral transistor LT are formed, respectively. The source/drain regions of the peripheral transistor LT have a LDD (Lightly Doped Drain) structure, and each include an n$^+$ type semiconductor region NM of an n type low density semiconductor region, and an n$^+$ type semiconductor region SD of an n type high density semiconductor region. Further, a metal silicide layer SIL is formed at each surface of the gate electrode Glt, and the n$^+$ type semiconductor regions SD forming the source/drain regions of the peripheral transistor LT. On the other hand, a metal silicide layer SIL is not formed at the floating diffusion FD forming the drain region of the transfer transistor TX forming the pixel PU. Therefore, the surface of the floating diffusion FD is covered with a silicide block film BLK described later. The silicdie block film BLK is formed of, for example, a silicon oxide film. In the present First Embodiment, the pixel region 1A is entirely covered with the silicdie block film BLK. However, the portion required to be covered with the silicdie block film BLK is the floating diffusion FD of the transfer transistor TX at which the metal silicide layer SIL is not desired to be formed. At other portions, the silicdie block film BLK does not have to be provided.

Over the semiconductor substrate SB, an interlayer insulation film IL1 is formed in such a manner as to cover the gate electrode Gt, the antireflection film ARF, and the gate electrode Glt. The interlayer insulation film IL1 is formed over the entire main surface of the semiconductor substrate SB including the pixel region 1A and the peripheral circuit region 2A. As described previously, in the pixel region 1A, each surface of the gate electrode Gt, the antireflection film ARF, and the floating diffusion FD is covered with the silicdie block film BLK. Over the silicdie block film BLK, the interlayer insulation film IL1 is formed.

The interlayer insulation film IL1 is formed of, for example, a silicon oxide film using TEOS (Tetra Ethyl Ortho Silicate) as a raw material. In the interlayer insulation film IL1, conductive plug electrodes PG such as the plug electrodes Pr1, Pr2, Pg, Pfd, Pa, Ps, Prg, Ptg, Pag, Psg, Pt1, and Pt2 are buried. For example, as shown in FIG. 6, over the n type semiconductor region NR as the floating diffusion FD, the plug electrode Pfd is formed as the plug electrode PG. The plug electrode Pfd penetrates through the interlayer insulation film IL1 to reach the n type semiconductor region NR, and is electrically coupled with the n type semiconductor region NR.

The plug electrodes PG such as the plug electrodes Pr1, Pr2, Pg, Pfd, Pa, Ps, Prg, Ptg, Pag, Psg, Pt1, and Pt2 are formed in the following manner. In each contact hole formed in the interlayer insulation film IL1, for example, a barrier conductor film, and a tungsten film formed over the barrier conductor film are buried. The barrier conductor film is formed of, for example, a lamination film of a titanium film and a titanium nitride film formed over the titanium film (i.e., a titanium/titanium nitride film).

Over the interlayer insulation film IL1 including the plug electrodes PG (Pr1, Pr2, Pg, Pfd, Pa, Ps, Prg, Ptg, Pag, Psg, Pt1, and Pt2) buried therein, for example, an interlayer insulation film IL2 is formed. In the interlayer insulation film IL2, a wire M1 is formed.

The interlayer insulation film IL2 is formed of, for example, a silicon oxide film, but is not limited thereto. The interlayer insulation film IL2 can also be formed of a low dielectric constant film with a lower dielectric constant than that of a silicon oxide film. Examples of the low dielectric film may include a SiOC film.

The wire M1 is formed of, for example, a copper wire, and can be formed using a damascene method. Incidentally, the wire M1 is not limited to a copper wire, and can also be formed of an aluminum wire. When the wire M1 is a buried copper wire (damascene copper wire) (FIGS. 6 and 7 correspond to this case), the buried copper wire is buried in the wire trench formed in the interlayer insulation film IL1. However, when the wire M1 is an aluminum wire, the aluminum wire is formed by patterning the conductive film formed over the interlayer insulation film.

Over the interlayer insulation film IL2 including the wire M1 formed therein, an interlayer insulation film IL3 formed of, for example, a silicon oxide film or a low dielectric constant film is formed. In the interlayer insulation film IL3, a wire M2 is formed. Further, over the interlayer insulation film IL3 including the wire M2 formed therein, an interlayer insulation film IL4 is formed. In the interlayer insulation film IL4, a wire M3 is formed. The wires M1 to M3 form the wiring layer. The wires M1 to M3 are formed in such a manner as not to overlap the photodiode two-dimensionally. This is for preventing the light incident upon the photodiode from being blocked by the wires M1 to M3.

Further, over the interlayer insulation film IL4 including the wire M3 formed therein, a microlens ML is mounted. Incidentally, a color filter may be provided between the microlens ML and the interlayer insulation film IL4.

In FIG. 6, when a light is applied to the pixel PU (see FIG. 1), first, the incident light passes through the microlens ML. Then, the light passes through the interlayer insulation films IL4 to IL1 transparent to a visible light, and then is made incident upon the antireflection film ARF. In the antireflection film ARF, the reflection of the incident light is suppressed, so that a sufficient light amount of the incident light is made incident upon the photodiode PD. In the photodiode PD, the energy of the incident light is larger than the bandgap of silicon. For this reason, the incident light is absorbed by photoelectric conversion to generate hole electron pairs. The electrons generated at this step are accumulated in the n type semiconductor region NW. Then, at a proper timing, the transfer transistor TX is rendered ON. Specifically, the gate electrode Gt of the transfer transistor TX is applied with a voltage equal to, or larger than the threshold voltage. Then, a channel region is formed in the channel formation region immediately under the gate insulation film GOX of the transfer transistor TX. This leads to an electrical conduction between the n type semiconductor region NW as the source region of the transfer transistor TX and the n type semiconductor region NR as the drain region of the transfer transistor TX. As a result, the electrons accumulated in the n type semiconductor region NW pass through the channel region to reach the drain region (n type semiconductor region NR), and run from the drain region (n type semiconductor region NR) through the plug electrode Pfd and the wiring layer, to be extracted to the external circuit.

Method for Manufacturing Semiconductor Device

Then, a method for manufacturing the semiconductor device of the present embodiment will be described by reference to FIGS. 7 to 22.

Figure 7:
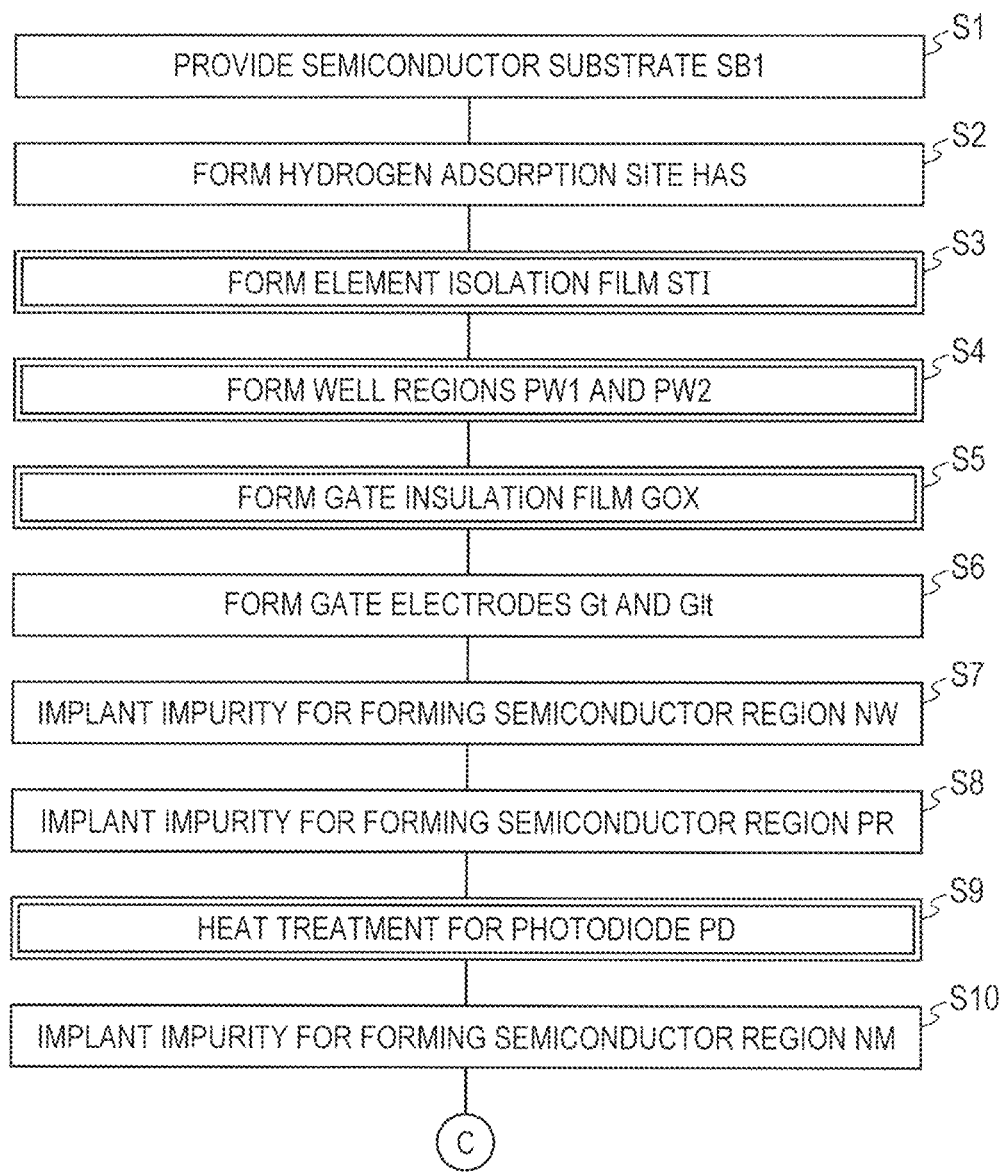
FIG. 7 is a process flowchart showing some of the manufacturing steps of the semiconductor device of First Embodiment.
Figure 8:
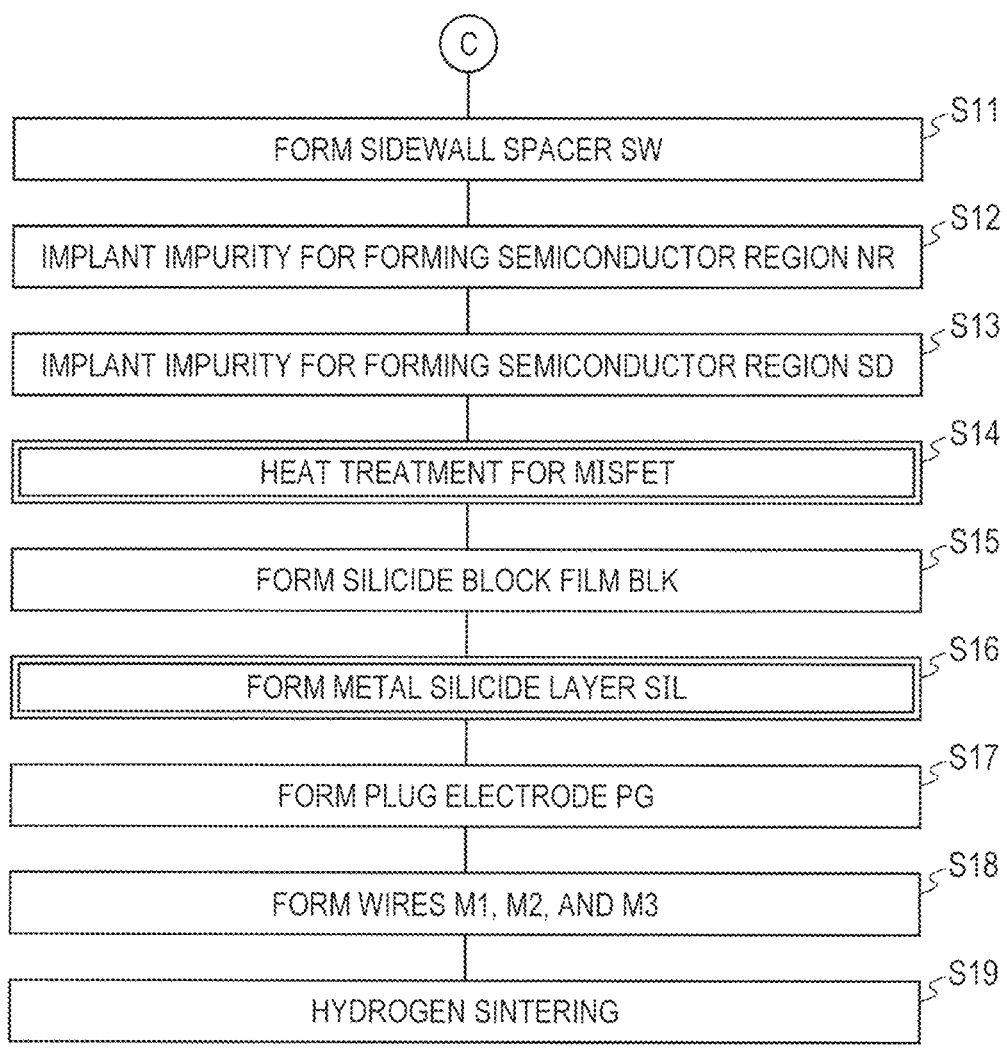
FIG. 8 is a process flowchart showing others of the manufacturing steps of the semiconductor device following FIG. 7.
Figure 19:
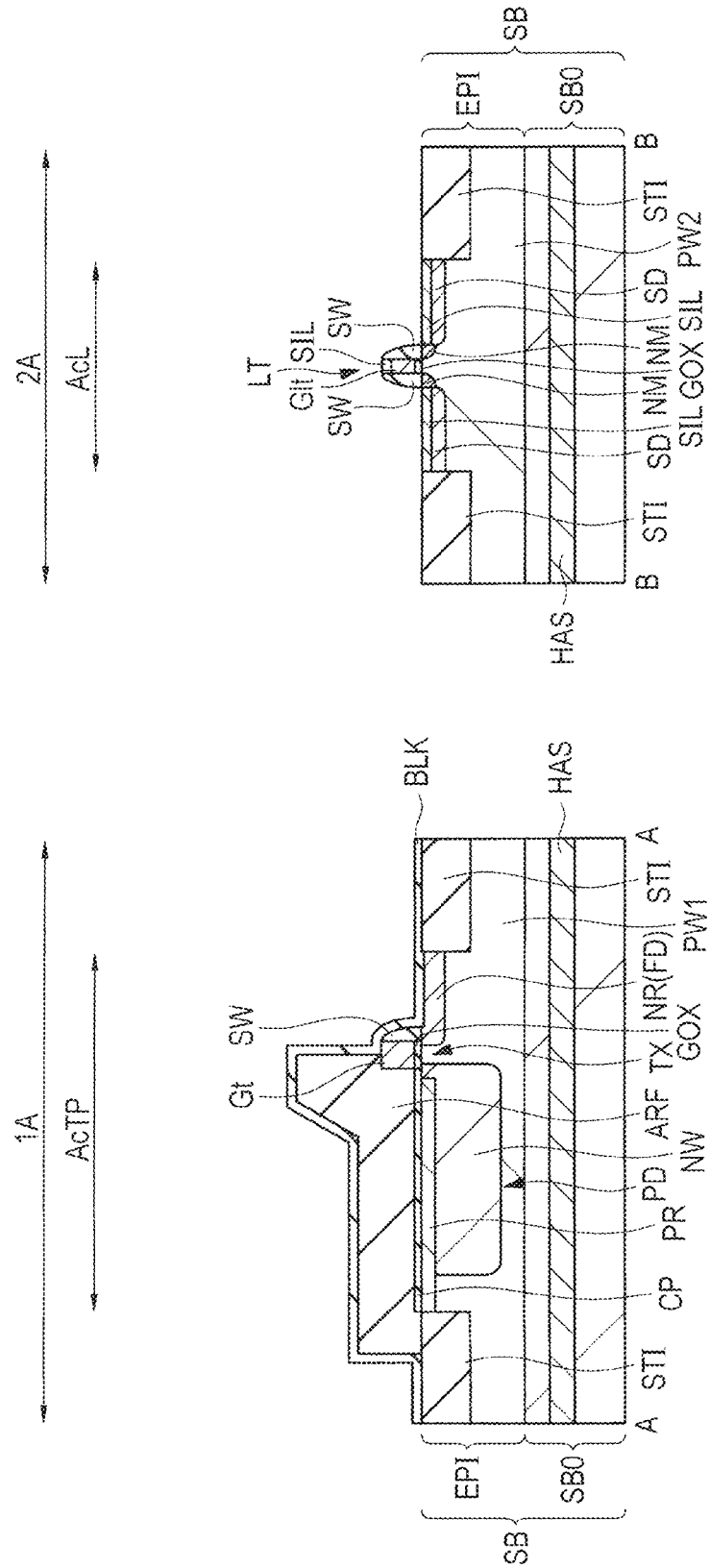
FIG. 19 is an essential part cross sectional view of the semiconductor device during the same manufacturing step as that of FIG. 18.
Figure 20:
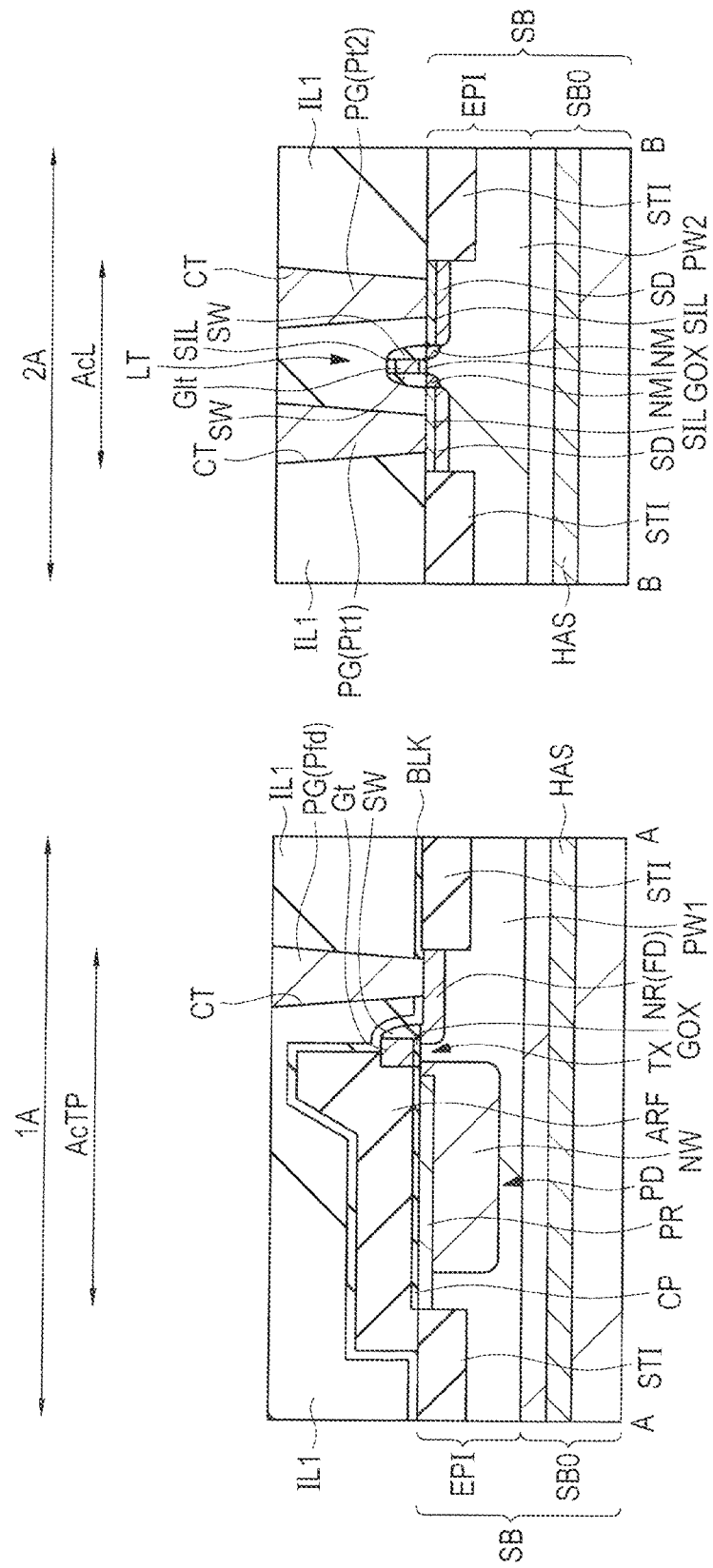
FIG. 20 is an essential part cross sectional view of the semiconductor device during a manufacturing step following FIG. 19.
Figure 21:
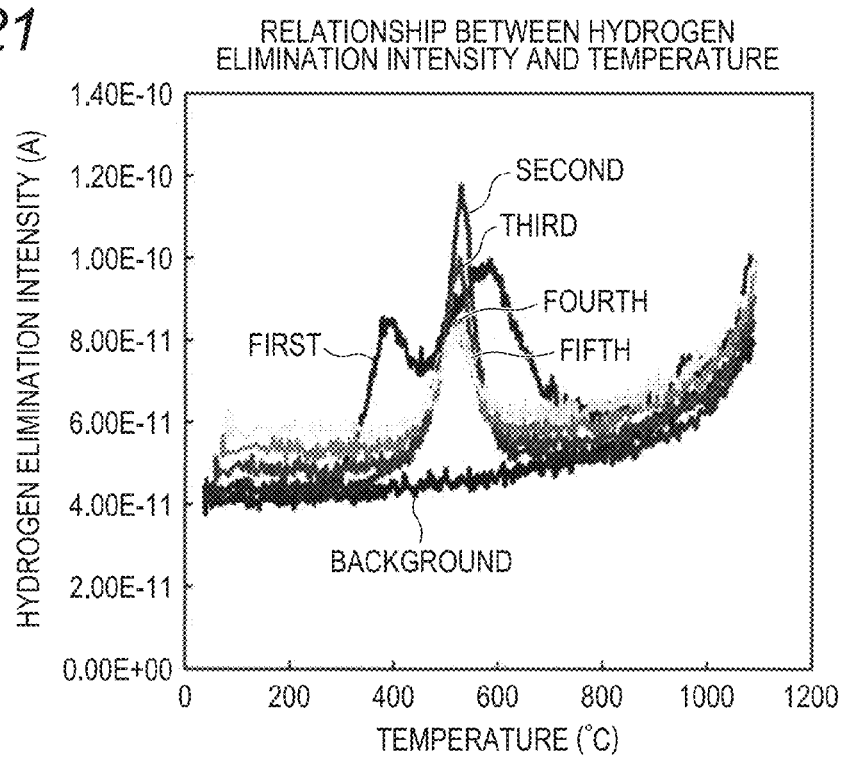
FIG. 21 is a graph showing the relationship between the hydrogen elimination intensity and the temperature.
Figure 22:
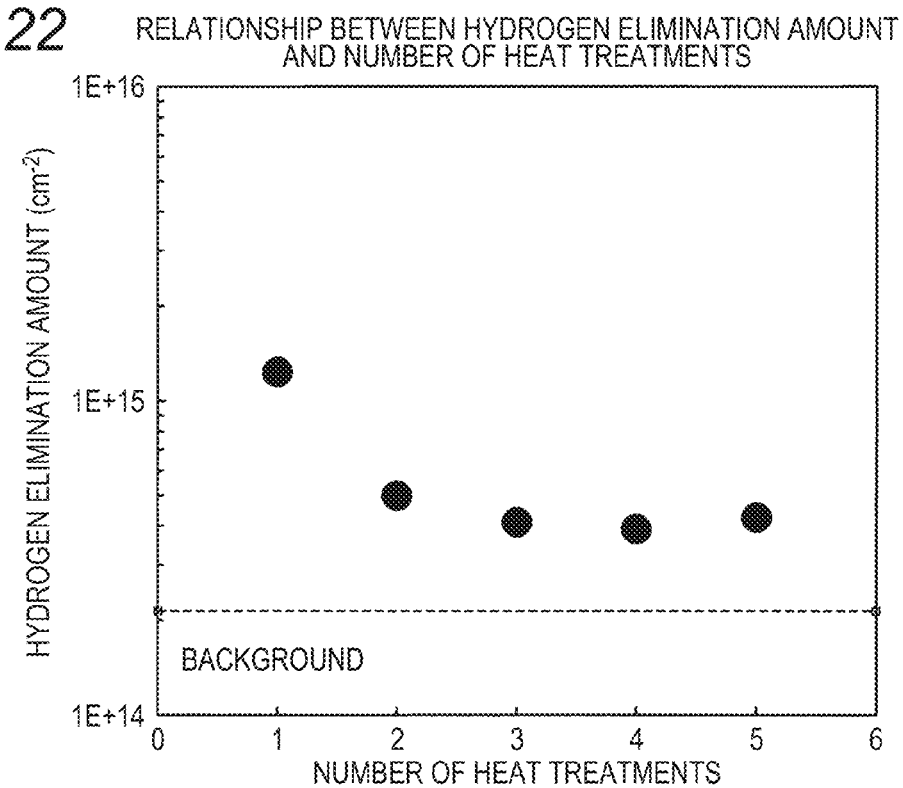
FIG. 22 is a graph showing the relationship between the hydrogen elimination amount and the number of heat treatments.

FIGS. 7 and 8 are process flowcharts showing some and others of the manufacturing steps of the semiconductor device of the present embodiment, respectively. FIGS. 9 to 20 are each an essential part cross sectional view of the semiconductor device of the present embodiment during a manufacturing step. FIG. 21 is a graph showing the relationship between the hydrogen elimination intensity and the temperature. FIG. 22 is a graph showing the relationship between the hydrogen elimination amount and the number of heat treatments.

Figure 9:
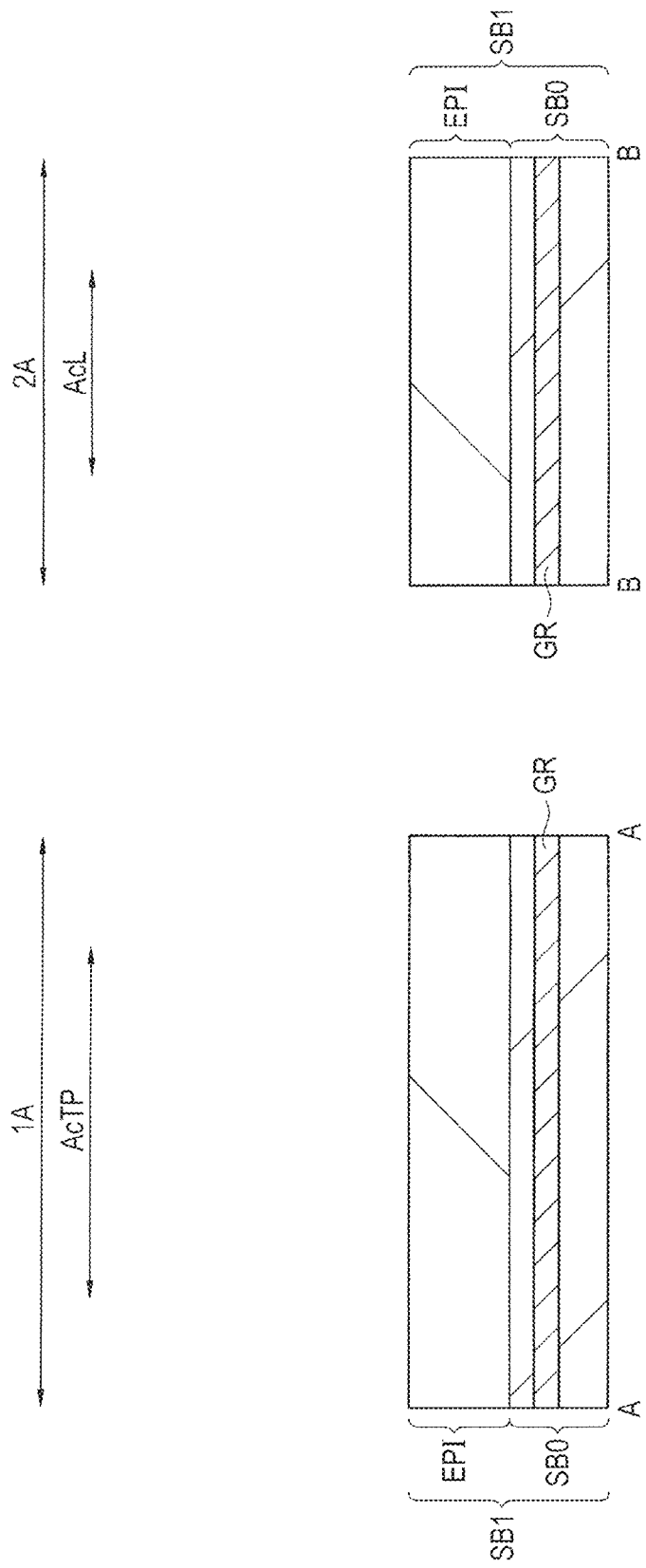
FIG. 9 is an essential part cross sectional view of the semiconductor device of First Embodiment during a manufacturing step.
Figure 10:
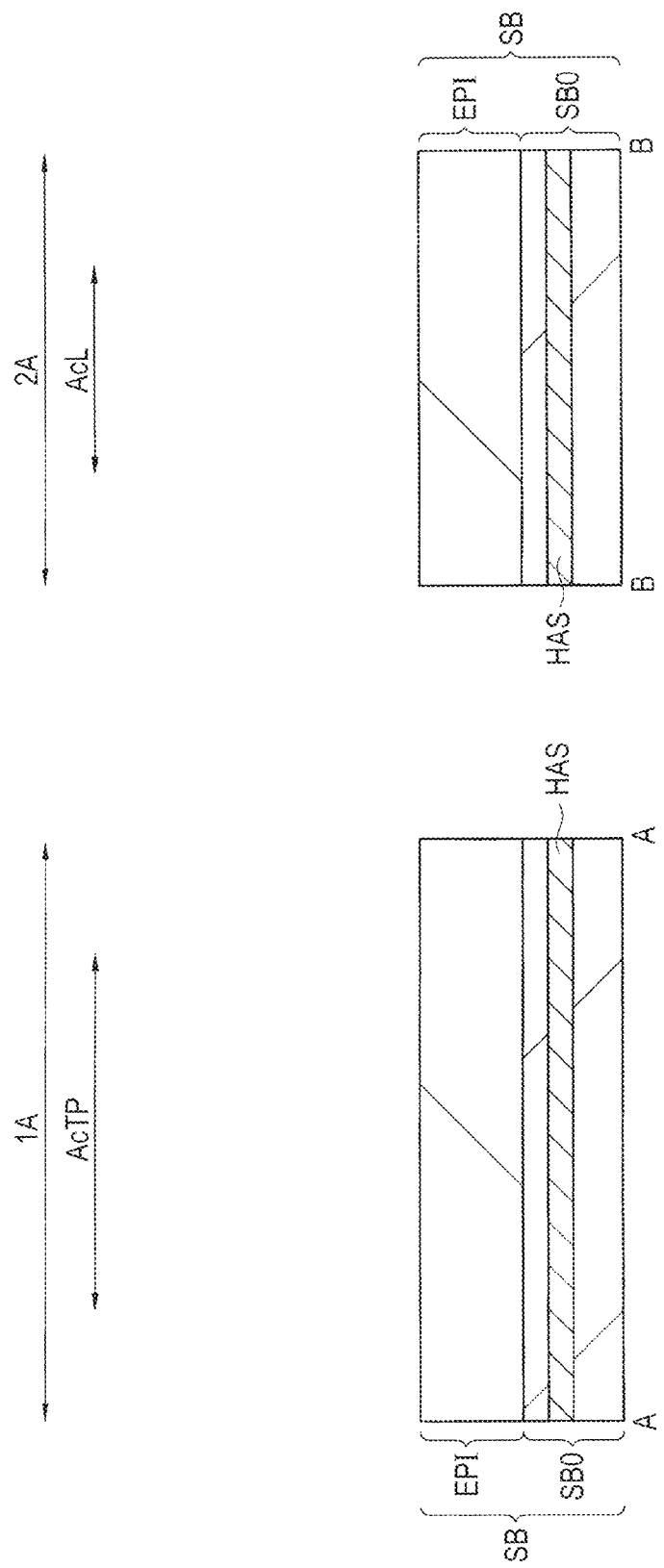
FIG. 10 is an essential part cross sectional view of the semiconductor device during a manufacturing step following FIG. 9.

First, a "semiconductor substrate SB1 provision" step (S1) shown in FIG. 7 is carried out. First, a semiconductor substrate SB1 shown in FIG. 9 is provided. The semiconductor substrate SB1 has a lamination structure of a semiconductor substrate (semiconductor wafer) SB0, and an epitaxial layer EPI over the semiconductor substrate SB0. The semiconductor substrate SB0 is formed of, for example, an n type single crystal silicon doped with an n type impurity such as phosphorus (P) or arsenic (As), or the like. The epitaxial layer EPI is also a single crystal silicon layer including an n type impurity (donor) such as phosphorus (P) or arsenic (As). Herein, the density relation and the conductivity type of the semiconductor substrate SB0/epitaxial layer EPI are set as n/n⁻. In the semiconductor substrate SB0, a gettering layer GR is formed. The gettering layer GR has a thickness of 0.05 to 1 μm, and is formed at a depth of 4 to 10 μm from the surface of the semiconductor substrate SB0 across the entire region of the semiconductor substrate SB0. The gettering layer GR is formed by, for example, ion implanting a cluster CxHy ($3 \leq x \leq 16$, and $3 \leq y \leq 10$) into the semiconductor substrate SB0. Herein, $C_3H_5$ was ion implanted with a density of $5 \times 10^{14}$ cm$^{-2}$, thereby to form the gettering layer GR.

In other words, the semiconductor substrate SB1 is formed in the following manner. The cluster CxHy is ion implanted into the semiconductor substrate SB0. Then, the epitaxial layer EPI is formed over the semiconductor substrate SB0. Incidentally, the epitaxial layer EPI is formed by passing a gas of silicon tetrachloride ($SiCl_4$) or silicon trichloride ($SiHCl_3$) in a furnace under ordinary pressure and at about 1200° C.

Then, a "hydrogen adsorption site HAS formation" step (S2) shown in FIG. 7 is carried out. Then, the semiconductor substrate SB1 shown in FIG. 9 is subjected to a heat treatment. As a result, In the region of the gettering layer GR shown in FIG. 9, a hydrogen adsorption site HAS is formed, thereby to provide the semiconductor substrate SB shown in FIG. 10. The semiconductor substrate SB includes the semiconductor substrate SB0, the epitaxial layer EPI thereover, and the hydrogen adsorption site HAS formed in the semiconductor substrate SB0. In the figures subsequent to FIG. 10 (including FIG. 6), only the hydrogen adsorption site HAS is shown. However, the hydrogen adsorption site HAS also has a function as the gettering layer GR shown in FIG. 9.

Herein, the hydrogen adsorption site HAS is a region having a function of adsorbing hydrogen from outside the semiconductor substrate SB in the manufacturing steps of the semiconductor device, and desorbing (eliminating) hydrogen in the semiconductor substrate SB. The present inventors consider that the hydrogen adsorption site HAS can be formed by subjecting the semiconductor substrate SB1 shown in FIG. 9 to a heat treatment at 800° C. or more. Further, the heat treatment is particularly effective when performed under reduced pressure equal to, or higher than medium vacuum. This is due to the following reason: for example, as shown in FIG. 21, the hydrogen adsorption site HAS is formed by releasing the hydrogen implanted by ion implantation once; thus, the vapor pressure is higher under reduced pressure, which facilitates elimination of hydrogen. In other words, the heat treatment at 800° C. or more is carried out under reduced pressure. This enables the hydrogen implanted by ion implantation to be fully released for a short time. For this reason, the hydrogen adsorption site HAS can be formed with efficiency by the technique. The medium vacuum means 100 to 0.1 Pa specified according to Japanese Industrial Standard (JIS).

Then, by reference to FIGS. 21 and 22, the hydrogen adsorption site HAS will be described. FIG. 21 is a graph showing the relationship between the hydrogen elimination intensity and the temperature. FIG. 22 is a graph showing the relationship between the hydrogen elimination amount and the number of heat treatments. FIG. 21 shows the hydrogen elimination intensity when the semiconductor substrate SB1 is subjected to temperature raising and temperature lowering steps repeatedly five times with the semiconductor substrate SB1 shown in FIG. 9 held in a vacuum chamber at $10^{-8}$ Pa. Temperature raising and temperature lowering were carried out at temperatures within the range of room temperature to 1100° C. Herein, the reason why the upper limit was set at 1100° C. is as follows: in the manufacturing steps of the semiconductor device, the temperature will not become higher than that. As indicated from FIG. 21, for the hydrogen elimination intensity, two measurement peaks were observed at temperatures in the vicinity of 400° C. and 600° C. in the first temperature raising step. On the other hand, in the second and subsequent temperature raising steps, the measurement peaks were observed at temperatures in the vicinity of 580° C. as distinct from the first measurement peaks. Further, as shown in FIG. 22, the hydrogen elimination amount was larger at the first temperature raising step. However, in the second and subsequent temperature raising steps, the hydrogen elimination amount was almost constant at 4 to $5 \times 10^{14}$ cm$^{-2}$. Further, the total amount of eliminated hydrogen by the five heat treatments was $3 \times 10^{15}$ cm$^2$ which is larger than the ion implantation amount ($5 \times 10^{14}$ cm$^{-2}$) of the cluster $C_3H_5$.

From the results, it can be considered as follows: in the first temperature raising step, the semiconductor substrate SB1 was subjected to a heat treatment at 800° C. or more; as a result, the hydrogen in the semiconductor substrate SB1 was desorbed (eliminated), so that the gettering layer GR portion of the semiconductor substrate SB1 was changed in structure, thereby to form the hydrogen adsorption site HAS. Then, it can be considered as follows. the hydrogen adsorption site HAS has a function of not only desorbing (eliminating) hydrogen at a prescribed temperature (in the vicinity of 580° C.) during the second or subsequent temperature raising, but also adsorbing hydrogen in the atmosphere during temperature lowering.

The present inventors considered as follows: preferably, at the initial stage of the manufacturing steps of the semiconductor device, the hydrogen adsorption site HAS is formed; then, the manufacturing steps of the semiconductor device are carried out. In other words, by forming the hydrogen adsorption site HAS first, the dangling bonds in the surface or the inside of the semiconductor substrate can be terminated by the hydrogen (hydrogen ion or hydrogen radical) desorbed (eliminated) from the hydrogen adsorption site HAS in all the manufacturing steps involving high temperatures of 600° C. or more. The dangling bond is generated in various steps such as a plasma CVD step or a dry etching step. It is very effective that the generated dangling bonds are terminated to reduce the interface level in the subsequent manufacturing steps. Particularly, it is very effective that the termination process of the dangling bonds can be sufficiently performed before a wiring step. Incidentally, as shown in FIG. 21, in the sense that hydrogen is fully eliminated from the hydrogen adsorption site HAS, the heat treatment at 600° C. or more of the upper limit temperature for hydrogen elimination is effective. However, a heat treatment at 400° C. or more of the lower limit temperature for hydrogen elimination causes hydrogen elimination from the hydrogen adsorption site HAS, and hence can be effective.

Then, the "element isolation film STI formation" step (S3) and the "well regions PW1 and PW2 formation" step (S4) shown in FIG. 7 are carried out. As indicated from FIGS. 3, 5, and 11, the element isolation films STI are formed in such a manner as to surround the active regions AcTP and AcL, respectively. The element isolation film STI is formed of an insulation film (e.g., silicon oxide film) buried in the trench of the semiconductor substrate SB. The "element isolation film STI formation" step (S3) includes a step of forming a silicon oxide film (pad insulation film) at the surface of the semiconductor substrate SB, a step of covering the regions to be the active regions such as the active regions AcTP and AcL of the semiconductor substrate SB with a silicon nitride film, and a step of etching the semiconductor substrate SB suing the silicon nitride film as an etching mask, and forming a trench for element isolation in the semiconductor substrate SB. The "element isolation film STI formation" step (S3) further includes a step of burying an insulation film such as a silicon oxide film in the trench for element isolation, a step of polishing and removing the insulation film outside the trench, and a step of heat-treating the insulation film in the trench at high temperatures for densification.

The first silicon oxide film (pad insulation film) is formed by thermally oxidizing the surface of the semiconductor substrate SB. The formation conditions are ordinary pressure, 800° C., and water vapor ($H_2O$) atmosphere. Further, densification is carried out in a nitrogen or oxygen atmosphere at a temperature of 1000 to 1100° C. In other words, by the heat treatments at 600° C. or more in the thermal oxidation step and the densification step, hydrogen is desorbed (eliminated) from the hydrogen adsorption site HAS, so that the dangling bonds are terminated. Then, at the time of temperature lowering of the semiconductor wafer SB, hydrogen is adsorbed into the hydrogen adsorption site HAS. Thus, hydrogen is desorbed (eliminated) from the hydrogen adsorption site HAS, so that the dangling bonds are terminated. Then, hydrogen is adsorbed into the hydrogen adsorption site HAS. A series of the treatments is referred to as a "termination process". In other words, the "element isolation film STI formation" step (S3) involves the "termination process".

In order to make the most use of the effect of the "termination process", it is essential that the "hydrogen adsorption site HAS formation" step (S2) is carried out before the "element isolation film STI formation" step (S3). In other words, it is essential that the "hydrogen adsorption site HAS formation" step (S2) is carried out before the thermal oxidation step described previously.

Figure 11:
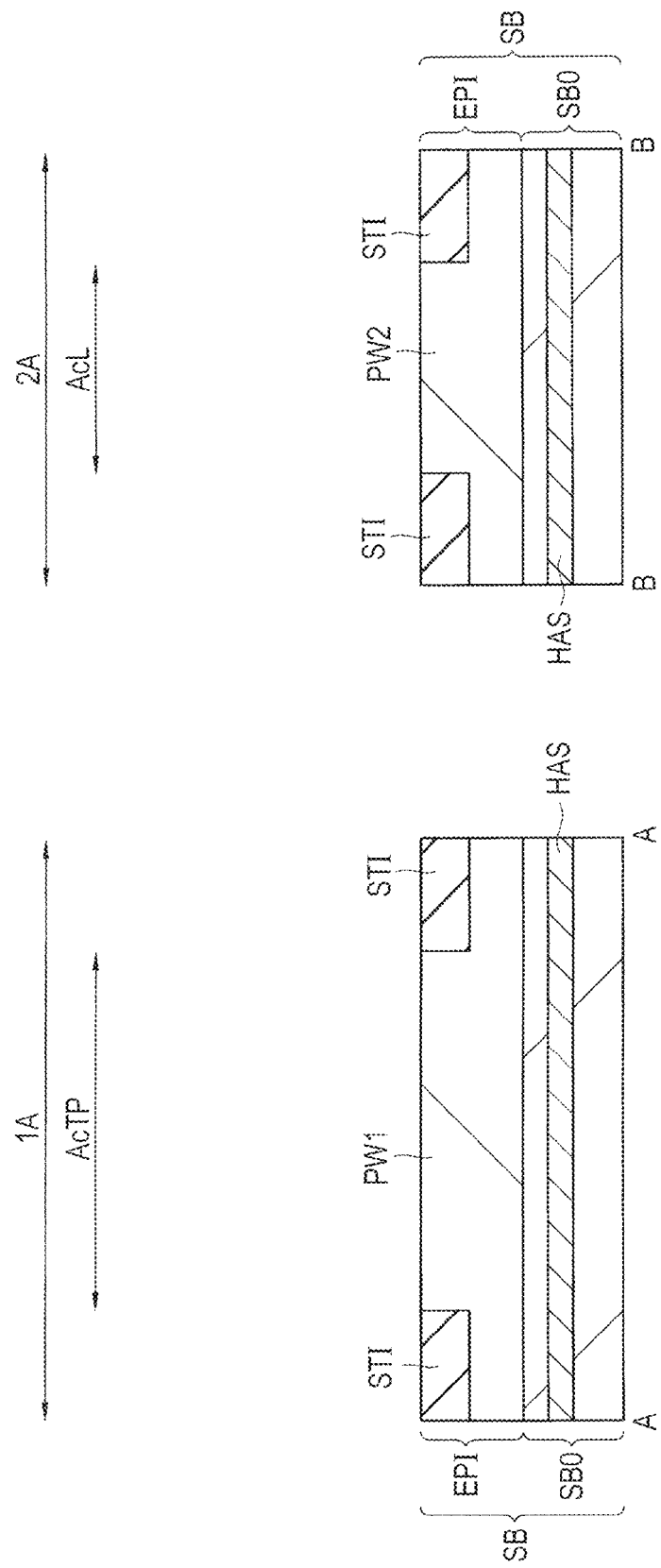
FIG. 11 is an essential part cross sectional view of the semiconductor device during the same manufacturing step as that of FIG. 10.

Then, as shown in FIG. 11, a step of forming a p type well region (p type semiconductor region) PW1 in the semiconductor substrate SB in the pixel region 1A, and a step of forming a p type well region (p type semiconductor region) PW2 in the semiconductor substrate SB in the peripheral circuit region 2A are carried out.

The p type well region PW1 is a p type semiconductor region for forming the photodiode PD, and is also a p type well region for forming the n channel type transfer transistor TX. The p type well region PW2 is a p type well region for forming the n channel type peripheral transistor LT.

The p type well regions PW1 and PW2 are respectively formed through to a prescribed depth from the main surface of the semiconductor substrate SB. The p type well regions PW1 and PW2 can be formed by ion implanting a p type impurity such as boron (B) into the semiconductor substrate SB, or other procedures.

The p type well region PW1 is formed across the region in which the photodiode PD is formed, and the region in which the transfer transistor TX is formed in the pixel region 1A. That is, in the pixel region 1A, the p type well region PW1 is formed in the entire active region AcTP. The p type well region PW2 is formed in the peripheral circuit region 2A. The ion implantation for forming the p type well region PW1, and the ion implantation for forming the p type well region PW2 are performed by different ion implantation steps, or performed by the same ion implantation steps.

Further, after the ion implantation step, the semiconductor substrate SB is subjected to a heat treatment step for well region in a nitrogen atmosphere at about 1000° C. (900° C. or more), so that the ion-implanted impurity is activated. Simultaneously, the "termination process" is carried out.

The conductivity type of the p type well regions PW1 and PW2 is a p type, and is a conductivity type opposite to the n type which is the conductivity type of the semiconductor substrate SB. The p type well regions PW1 and PW2 are deeper than the element isolation film STI with reference to the main surface of the semiconductor substrate SB.

In other words, the "well regions PW1 and PW2 formation" step (S4) includes the ion implantation step and the heat treatment step for well region, and involves the "termination process".

Incidentally, in the present embodiment, a description has been given to the case where the peripheral transistor LT formed in the peripheral circuit region 2A is an n channel type MISFET. However, by reversing the conductivity type, the peripheral transistor LT may also be a p channel type MISFET. Alternatively, both of the n channel type MISFET and the p channel type MISFET may also be formed in the peripheral circuit region 2A.

Figure 12:
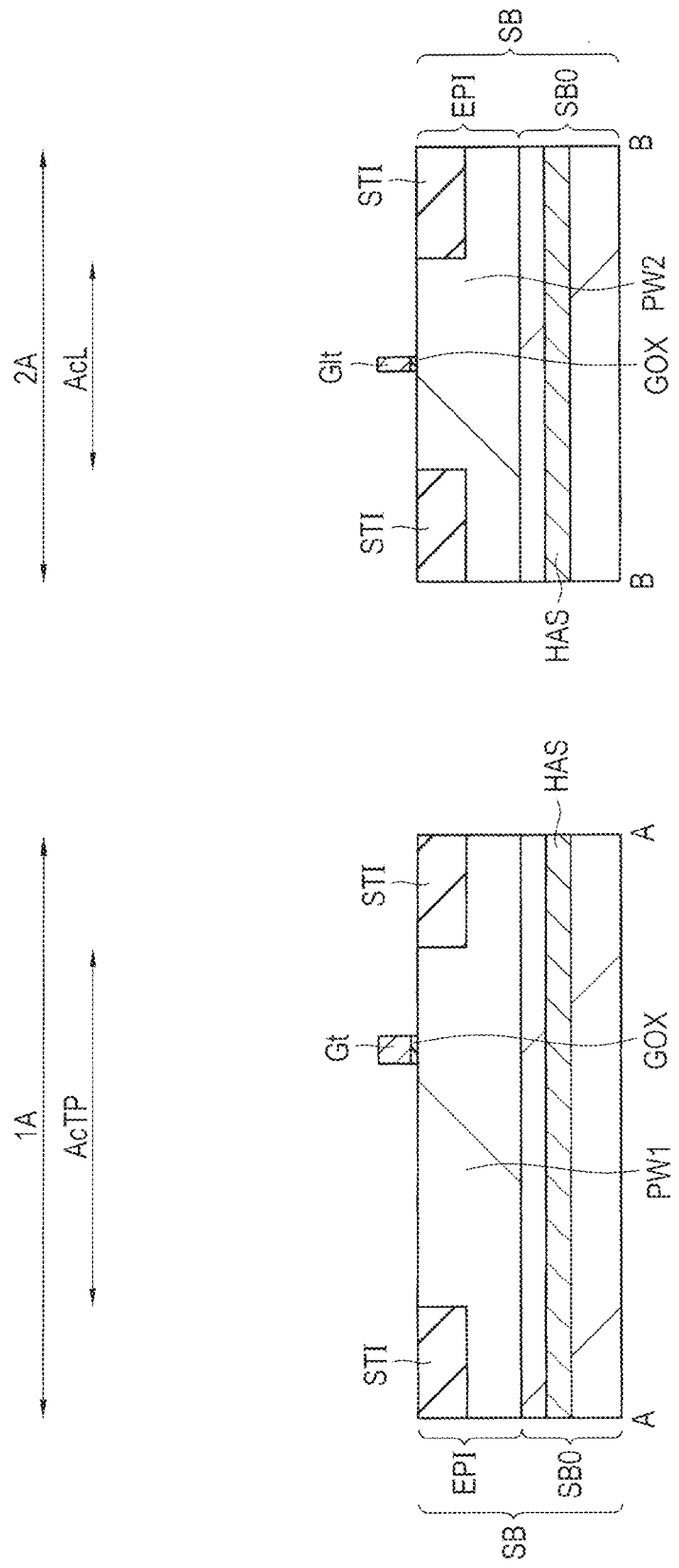
FIG. 12 is an essential part cross sectional view of the semiconductor device during a manufacturing step following FIG. 11.

Then, the "gate insulation film GOX formation" step (S5) and the "gate electrodes Gt and Glt formation" step (S6) shown in FIG. 7 are carried out. As shown in FIG. 12, in the pixel region 1A, over the semiconductor substrate SB (p type well region PW1), a gate insulation film GOX and a gate electrode Gt for the transfer transistor TX are formed. In the peripheral circuit region 2A, over the semiconductor substrate SB (p type well region PW2), an gate insulation film GOX and a gate electrode Glt for the peripheral transistor LT are formed.

That is, first, the main surface of the semiconductor substrate SB is purified by a cleaning treatment or the like. Then, at the main surface of the semiconductor substrate SB, an insulation film for the gate insulation film GOX is formed. The insulation film for the gate insulation film GOX is formed of, for example, a silicon oxide film, and can be formed using a thermal oxidation method or the like. With the thermal oxidation method, hydrogen ($H_2$) and oxygen ($O_2$) are passed into a furnace under normal pressure at 900 to 1100° C., thereby to form a silicon oxide film. Therefore, the step includes a "termination process". As another form, as the insulation film for the gate insulation film GOX, a high dielectric constant insulation film such as silicon oxynitride film or a metal oxide film (e.g., hafnium oxide film) can also be used.

Then, as shown in FIG. 12, over the semiconductor substrate SB, namely, over the insulation film for the gate insulation film GOX, a conductive film (e.g., a polycrystal silicon film) for gate electrode is formed using a CVD (Chemical Vapor Deposition) method or the like. Then, the conductive film for gate electrode is patterned using a photolithography method and a dry etching method. As a result, the gate electrodes Gt and Glt formed of the patterned conductive film (e.g., polycrystal silicon film) can be formed. The portions of the insulation film for the gate insulation film GOX left under the gate electrodes Gt and Glt serve as the gate insulation film GOX. Further, the dry etching for patterning the conductive film for gate electrode, or wet etching after the dry etching can remove the portions of the insulation film for the gate insulation film GOX in the regions not covered with the gate electrodes Gt and Glt. When the conductive film for gate electrode is patterned to form the gate electrodes Gt and Glt, for example, the gate electrode Gr, the gate electrode Gs, and the gate electrode Ga of other transistors shown in FIG. 3, namely, the reset transistor RST, the selection transistor SEL, and the amplification transistor AMI can also be formed together.

The gate electrode Gt functions as the gate electrode of the transfer transistor TX, and is formed over the semiconductor substrate SB (p type well region PW1) via the gate insulation film GOX in the pixel region 1A. The gate insulation film GOX under the gate electrode Gt functions as the gate insulation film of the transfer transistor TX. The gate electrode Glt functions as the gate electrode of the peripheral transistor LT, and is formed over the semiconductor substrate SB (p type well region PW2) via the gate insulation film GOX in the peripheral circuit region 2A. The gate insulation film GOX under the gate electrode Glt functions as the gate insulation film of the peripheral transistor LT.

Figure 13:
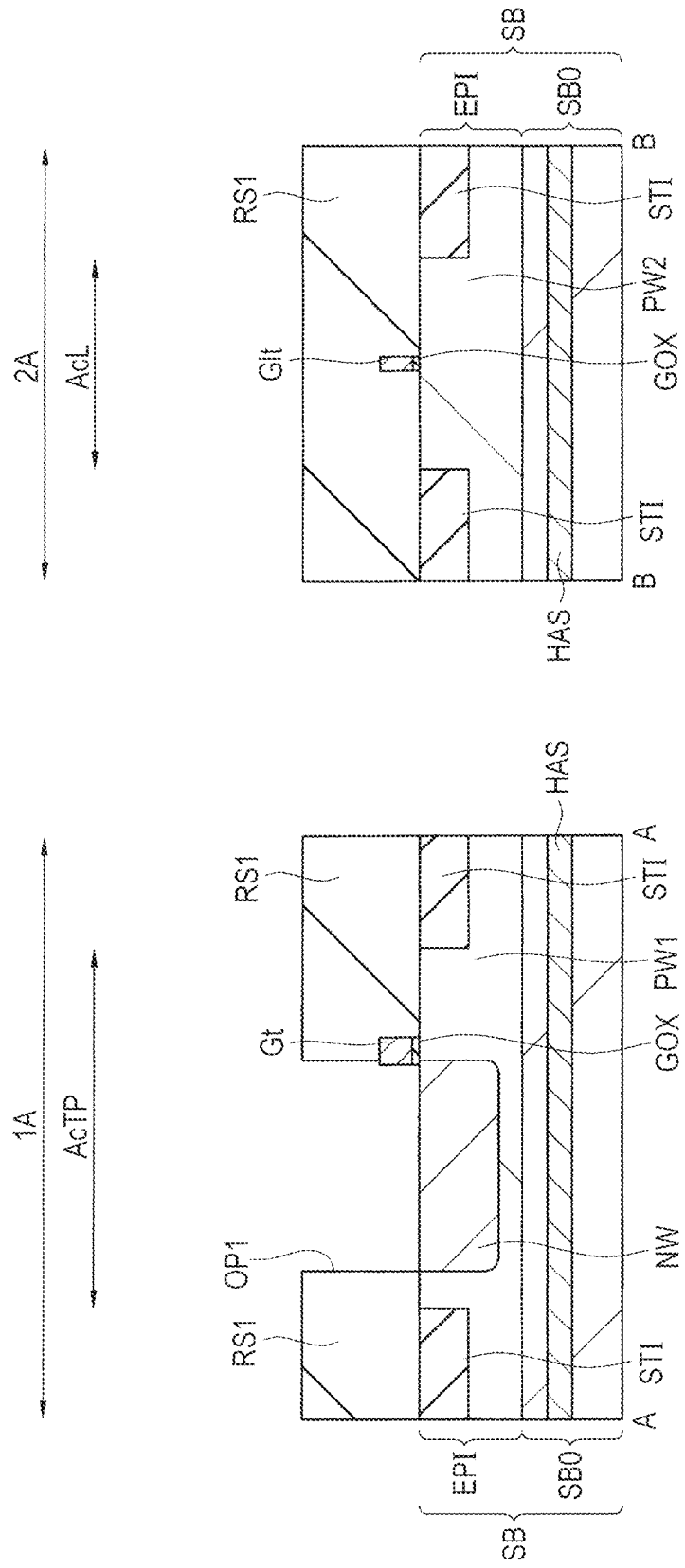
FIG. 13 is an essential part cross sectional view of the semiconductor device during the same manufacturing step as that of FIG. 12.

Then, the "semiconductor region NW forming impurity implantation" step (S7) shown in FIG. 7 is carried out. As shown in FIG. 13, in the semiconductor substrate SB in the active region AcTP in the pixel region 1A, an n type semiconductor region NW is formed. The n type semiconductor region NW can be formed by ion implanting an n type impurity such as phosphorus (P) or arsenic (As) into the semiconductor substrate SB in the active region AcTP in the pixel region 1A.

The n type semiconductor region NW is an n type semiconductor region for forming the photodiode PD. The depth of (the bottom surface) of the n type semiconductor region NW is smaller than the depth of (the bottom surface) of the p type well region PW1. The n type semiconductor region NW is formed in such a manner as to be internally included in the p type well region PW1. The n type semiconductor region NW is formed in such a manner as to be internally included in the p type well region PW1, and hence the bottom surface and the side surface of the n type semiconductor region NW are in contact with the p type well region PW1.

The n type semiconductor region NW is not formed in the entire active region AcTP in the pixel region 1A, but is formed on one side (source side) of the regions on the opposite sides of the gate electrode Gt in the semiconductor substrate SB in the active region AcTP, and is not formed on the other side (drain side) thereof.

The n type semiconductor region NW can be formed specifically, for example, in the following manner. That is, as shown in FIG. 13, first, over the semiconductor substrate SB, a photoresist pattern (photoresist layer) RS1 is formed as a resist layer using a photolithography technology. The photoresist pattern RS1 has an opening OP1 opening (exposing) one side (source side) of the opposite sides of the gate electrode Gt in the active region AcTP in the pixel region 1A. The other side (drain side) of the opposite sides of the gate electrode GT in the active region AcTP in the pixel region 1A is covered with the photoresist pattern RS1. Then, using the photoresist pattern RS1 as a mask (ion implantation inhibiting mask), n type impurity ions are ion implanted into the semiconductor substrate SB. As a result, the n type impurity ions are ion implanted into the semiconductor substrate SB at a position overlapping the opening OP1 in a plan view in the pixel region 1A. Accordingly, the n type semiconductor region NW is formed in such a manner as to be internally included in the p type well region PW1 in the semiconductor substrate SB in the active region AcTP in the pixel region 1A. Thereafter, the photoresist pattern RS1 is removed.

Incidentally, in the ion implantation step for forming the n type semiconductor region NW, as shown in FIG. 13, the photoresist pattern RS1 is formed in the entire peripheral circuit region 2A. That is, in the entire peripheral circuit region 2A, the photoresist pattern RS1 is formed over the semiconductor substrate SB in such a manner as to cover the gate electrode Glt. For this reason, in the ion implantation step for forming the n type semiconductor region NW, in the semiconductor substrate SB (p type well region PW2) in the peripheral circuit region 2A, the photoresist pattern RS1 functions as a mask (ion implantation inhibiting mask), and hence ion implantation is not effected. In other words, during the ion implantation for forming the n type semiconductor region NW, the portions of the semiconductor substrate SB in other regions than the n type semiconductor region NW forming region are covered with the photoresist pattern RS1. Thus, an n type impurity is ion implanted into the n type semiconductor region NW forming region selectively.

Figure 14:
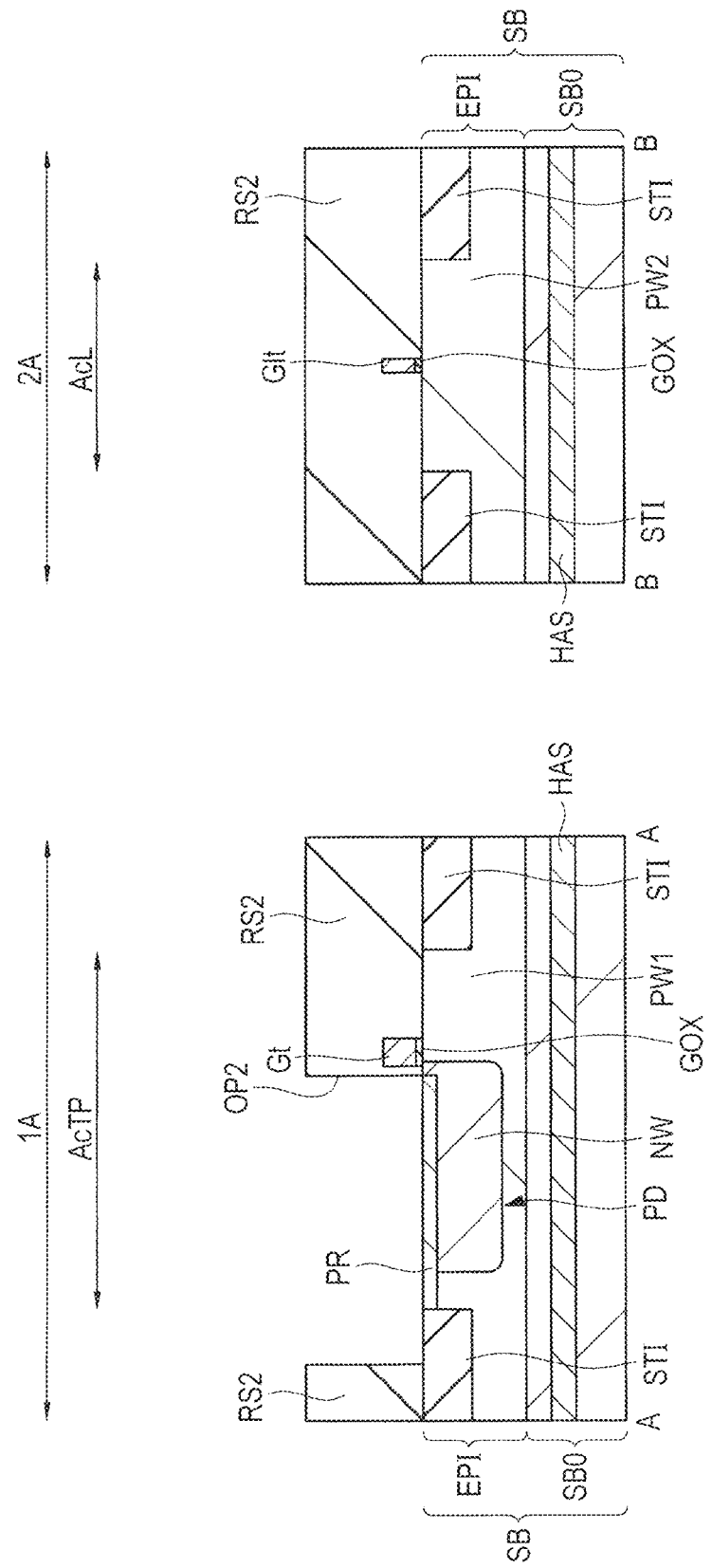
FIG. 14 is an essential part cross sectional view of the semiconductor device during a manufacturing step following FIG. 13.

Then, the "semiconductor region PR forming impurity implantation" step (S8) shown in FIG. 7 is carried out. As shown in FIG. 14, a $p^+$ type semiconductor region PR is formed in the semiconductor substrate SB in the active region AcTP in the pixel region 1A.

The $p^+$ type semiconductor region PR is formed by ion implanting an impurity such as boron (B) into the semiconductor substrate SB. The $p^+$ type semiconductor region PR is a $p^+$ type semiconductor region doped with a p type impurity with a high density. The impurity density (p type impurity density) of the $p^+$ type semiconductor region PR is higher than the impurity density (p type impurity density) of the p type well region PW1.

The depth of (the bottom surface) of the $p^+$ type semiconductor region PR is smaller than the depth of (the bottom surface) of the n type semiconductor region NW. The $p^+$ type semiconductor region PR is formed mainly at the front surface layer portion (front surface region) of the n type semiconductor region NW. For this reason, as seen in the thickness direction of the semiconductor substrate SB, the n type semiconductor region NW is present under the uppermost-layer $p^+$ type semiconductor region PR, and the p type well region PW1 is present under the n type semiconductor region NW.

The type semiconductor region PR can be formed specifically, for example, in the following manner. That is, as shown in FIG. 14, first, a photoresist pattern (photoresist layer) RS2 is formed as a resist layer over the semiconductor substrate SB using a photolithography technology. The photoresist pattern RS2 has an opening OP2 opening (exposing) the $p^+$ type semiconductor region PR forming region in the active region AcTP in the pixel region 1A. As shown in FIG. 14, the photoresist pattern RS2 entirely covers the gate electrode Gt. One sidewall of the photoresist pattern RS2 forming the opening OP2 is situated over the n type semiconductor region NW. Whereas, the other sidewall thereof is situated over the element isolation film STI. Then, using the photoresist pattern RS2 as a mask (ion implantation inhibiting mask), an impurity such as boron (B) is ion implanted into the semiconductor substrate SB. AS a result, in the pixel region 1A, the $p^+$ type semiconductor region PR is formed in the front surface layer portion of the p type well region PW1, and the front surface layer portion of the n type semiconductor region NW. Thereafter, the photoresist pattern RS2 is removed.

Incidentally, in the ion implantation step for forming the type semiconductor region PR, as shown in FIG. 14, the photoresist pattern RS2 is formed entirely in the peripheral circuit region 2A. That is, in the entire peripheral circuit region 2A, the photoresist pattern RS2 is formed over the semiconductor substrate SB in such a manner as to cover the gate electrode Glt. For this reason, in the ion implantation step for forming the p⁺ type semiconductor region PR, in the semiconductor substrate SB (p type well region PW2) in the peripheral circuit region 2A, the photoresist pattern RS2 functions as a mask (ion implantation inhibiting mask), and hence ion implantation is not effected.

Further, in the region in which the n type semiconductor region NW is not formed, a part of the type semiconductor region PR is in contact with the p type well region PW1. That is, the p⁺ type semiconductor region PR has a portion immediately under which the n type semiconductor region NW is present, and which is in contact with the n type semiconductor region NW, and a portion immediately under which the p type well region PW1 is present, and which is in contact with the p type well region PW1.

The p type well region PW1 is a p type semiconductor region for forming the photodiode PD, and the n type semiconductor region NW is an n type semiconductor region for forming the photodiode PD. The p⁺ type semiconductor region PR is a p type semiconductor region for forming the photodiode PD. The p type well region PW1 (p type semiconductor region), the n type semiconductor region NW, and the p⁺ type semiconductor region PR form the photodiode (PN junction diode) PD. Between the p type well region PW1 and the n type semiconductor region NW, a PN junction is formed. Whereas, between the p⁺ type semiconductor region PR and the n type semiconductor region NW, a PN junction is formed.

Then, the "photodiode PD heat treatment" step (S9) shown in FIG. 7 is carried out. The semiconductor substrate SB is subjected to a heat treatment, thereby to activate the ion-implanted semiconductor region NW forming impurity and the semiconductor region PR forming impurity. In FIGS. 13 and 14, for ease of understanding, the shapes of the semiconductor regions NW and PR after activation are shown. However, precisely, the shapes shown in FIGS. 13 and 14 are formed after completion of the "photodiode PD heat treatment" step (S9). Incidentally, the same also applies to the semiconductor regions in later steps. The heat treatment can be performed by, for example, laser annealing, microwave annealing, RTA (Rapid thermal annealing), or furnace annealing, or combinations thereof. The heat treatment temperature is set at about 1000° C. (900° C. or more). Simultaneously with the heat treatment step, the "termination process" is carried out.

Figure 15:
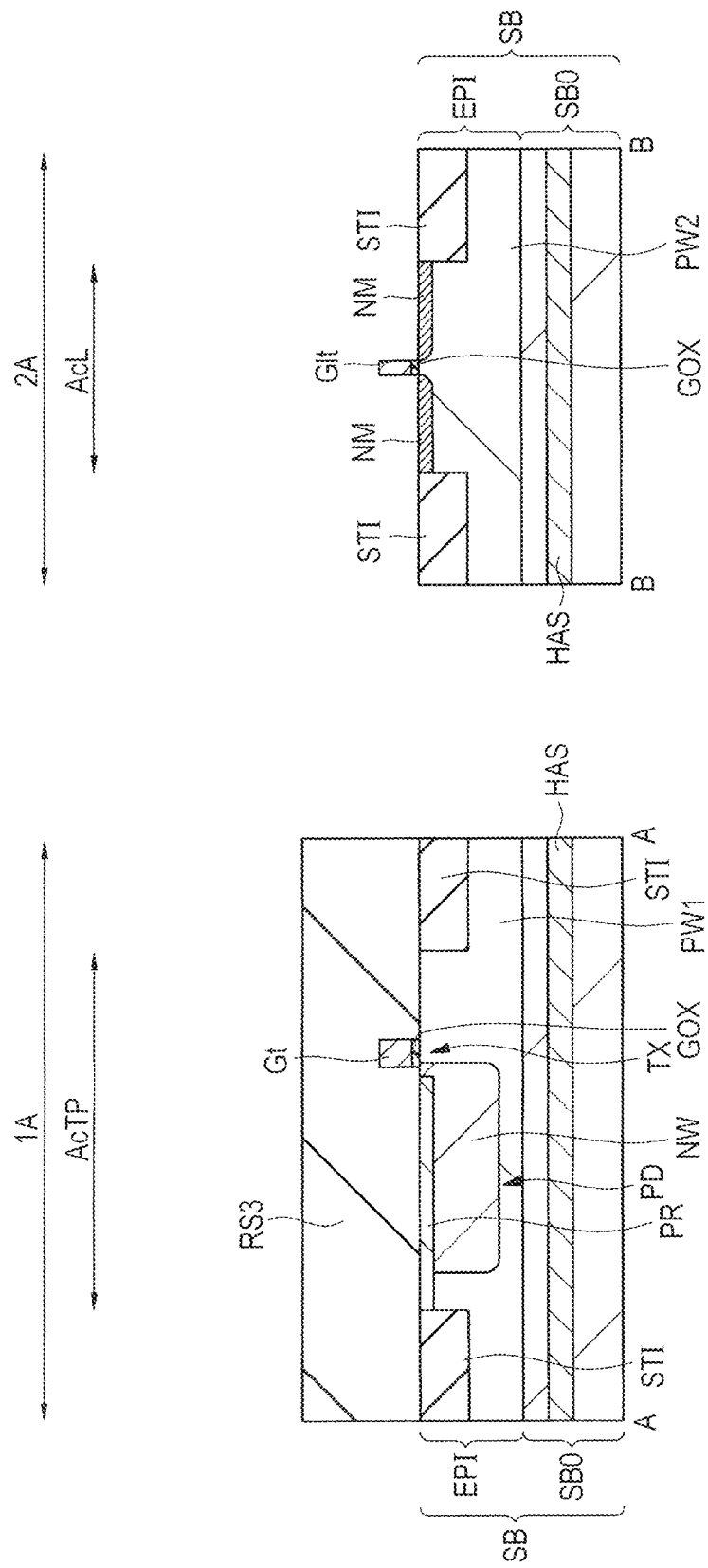
FIG. 15 is an essential part cross sectional view of the semiconductor device during the same manufacturing step as that of FIG. 14.

Then, the "semiconductor region NM forming impurity implantation" step (S10) shown in FIG. 7 is carried out. As shown in FIG. 15, in the peripheral circuit region 2A, in portions of the semiconductor substrate SB (p type well region PW2) on the opposite sides of the gate electrode Glt, n⁻ type semiconductor regions (source/drain extension regions) NM are formed.

The n⁻ type semiconductor region NM can be formed specifically, for example, in the following manner. That is, as shown in FIG. 15, first, over the semiconductor substrate SB, a photoresist pattern (photoresist layer) RS3 opening (exposing) the peripheral circuit region 2A is formed using a photolithography technology. Then, using the photoresist pattern RS3 as a mask (ion implantation inhibiting mask), an n type impurity such as phosphorus (P) or arsenic (As) is ion implanted into the semiconductor substrate SB (p type well region PW2) in the peripheral circuit region 2A. At this step, in the peripheral circuit region 2A, the gate electrode Glt functions as a mask (ion implantation inhibiting mask). For this reason, in the region of the semiconductor substrate SB immediately under the gate electrode Glt, implantation of the impurity is prevented. Accordingly, the n type impurity is ion implanted into the regions of the semiconductor substrate SB (p type well region PW2) on the opposite sides of the gate electrode Glt in the peripheral circuit region 2A. As a result, n⁻ type semiconductor regions NM are formed. Thereafter, the photoresist pattern RS3 is removed.

Incidentally, in the ion implantation step for forming the n⁻ type semiconductor regions NM, as shown in FIG. 15, in the pixel region 1A, the photoresist pattern RS3 is formed over the semiconductor substrate SB including the surface of the gate electrode Gt. That is, the active region AcTP in the pixel region 1A is covered with the photoresist pattern RS3. For this reason, in the ion implantation step for forming the n⁻ type semiconductor regions NM, in the semiconductor substrate SB in the active region AcTP, the photoresist pattern RS3 functions as a mask (ion implantation inhibiting mask). For this reason, ion implantation is not effected. Accordingly, in the ion implantation step for forming the n⁻ type semiconductor regions NM, ions are not implanted into the p type well region PW1, the n type semiconductor region NW, and the p⁺ type semiconductor region PR in the active region AcTP.

Figure 16:
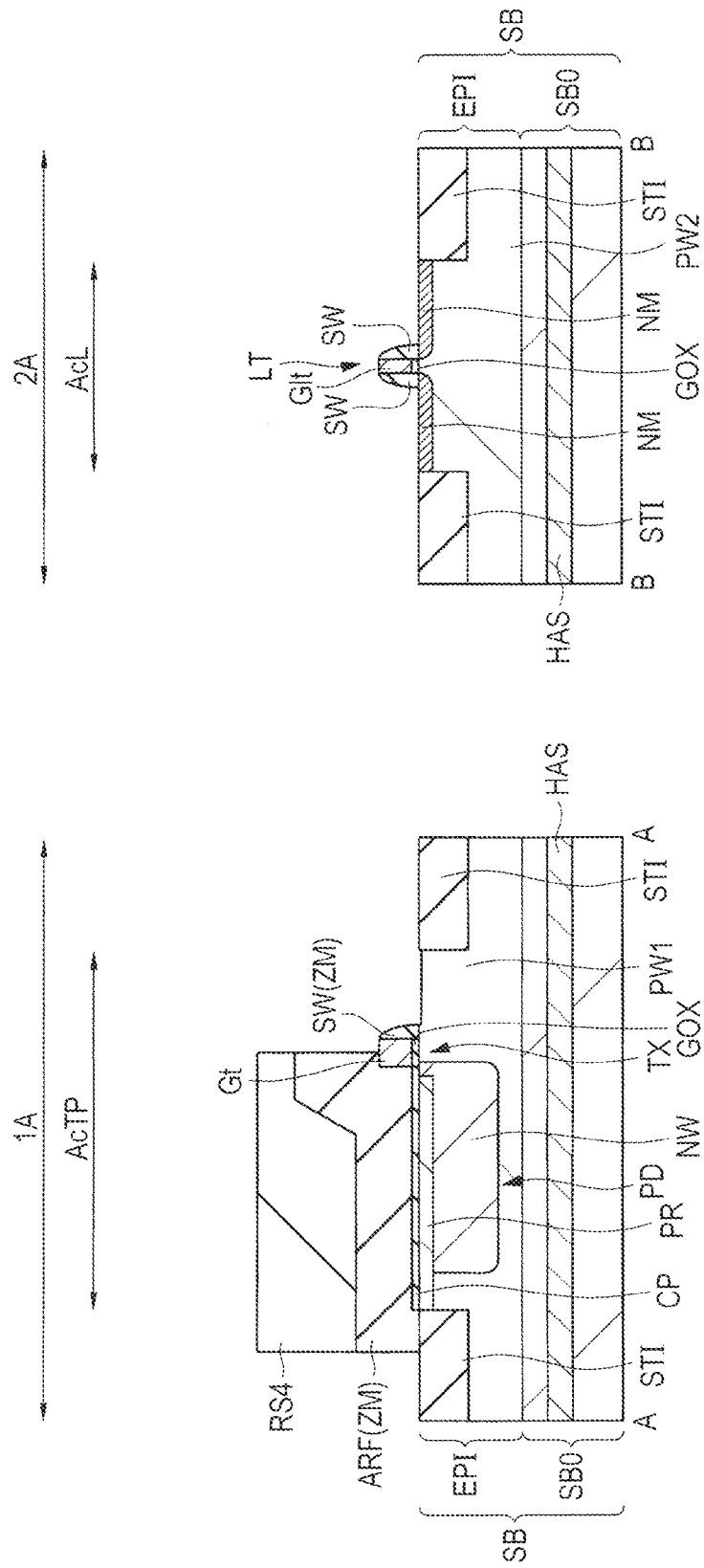
FIG. 16 is an essential part cross sectional view of the semiconductor device during a manufacturing step following FIG. 15.

Then, the "sidewall spacer SW formation" step (S11) shown in FIG. 8 is carried out. As shown in FIG. 16, over the semiconductor substrate SB in the pixel region 1A, a cap insulation film CP, an antireflection film ARF, and a sidewall spacer SW are formed.

First, the cap insulation film CP can be formed in the following manner. For example, over the main surface of the semiconductor substrate SB, an insulation film is formed. Then, the insulation film is patterned using a photolithography method and a dry etching method. The cap insulation film CP can be formed of, for example, a silicon oxide film or a silicon nitride film. The cap insulation film CP is formed over the front surfaces (exposed surfaces) of the n type semiconductor region NW and the p⁺ type semiconductor region PR. The cap insulation film CP is formed in order to keep good the surface characteristics, namely, the interface characteristics of the semiconductor substrate SB.

Then, the antireflection film ARF and the sidewall spacer SW are formed. The antireflection film ARF is formed over the cap insulation film CP, and the sidewall spacers SW are formed over the sidewalls of the gate electrodes Gt and Glt, respectively.

The antireflection film ARF and the sidewall spacer SW can be formed, for example, in the following manner. That is, first, over the main surface of the semiconductor substrate SB, an insulation film ZM is formed in such a manner as to cover the gate electrodes Gt and Glt. The insulation film ZM serves as both of an antireflection film ARF forming insulation film, and a sidewall spacer SW forming insulation film. Then, over the insulation film ZM in the region in which the antireflection film ARF is formed, a photoresist pattern RS4 is formed using a photolithography technology. The photoresist pattern RS4 entirely covers the source side of the transfer transistor TX. In other words, the photoresist pattern RS4 entirely covers the n type semiconductor region NW and the p⁺ type semiconductor region PR provided on the source side of the transfer transistor TX. As shown in FIG. 16, one end of the photoresist pattern RS4 is situated over the gate electrode Gt, and the other end thereof is situated over the element isolation film STI. Further, the photoresist pattern RS4 exposes a part of the gate electrode Gt of the transfer transistor TX, and the drain region thereof and the peripheral circuit region 2A. Incidentally, the insulation film ZM forming the antireflection film ARF is formed of, for example, a silicon nitride film, a silicon oxynitride film, or a lamination film of a silicon oxide film and a silicon nitride film.

Using the photoresist pattern RS4 as a mask (etching mask), the insulation film ZM is etched back by anisotropic etching such as a RIE (Reactive Ion Etching) method. As a result, the insulation film ZM is locally left over the sidewalls of the gate electrodes Gt and Glt, thereby to form the sidewall spacers SW. In addition, the insulation film ZM is left under the photoresist pattern RS4, thereby to form the antireflection film ARF. The antireflection film ARF is formed over the n type semiconductor region NW and the $p^+$ type semiconductor region PR via the cap insulation film CP. A part (end) of the antireflection film ARF extends over the gate electrode Gt.

Over the opposite sidewalls of the gate electrode Glt, the sidewall spacers SW are formed. Whereas, for the gate electrode Gt, the sidewall spacer SW is formed over the sidewall on the drain side (floating diffusion FD side) of the opposite sidewalls of the gate electrode Gt. The sidewall on the source side of the gate electrode Gt is covered with the antireflection film ARF.

The anisotropic etching is performed using $CHF_3$, $CH_4$, and Ar gases under the conditions of a RF bias of 1 kW. In the anisotropic etching, the surfaces of the portions of the semiconductor substrate SB in the floating diffusion FD forming region of the transfer transistor TX, and in the source/drain forming regions of the peripheral transistor LT. FIG. 16 shows this stage. Then, the photoresist pattern RS4 is removed.

Figure 17:
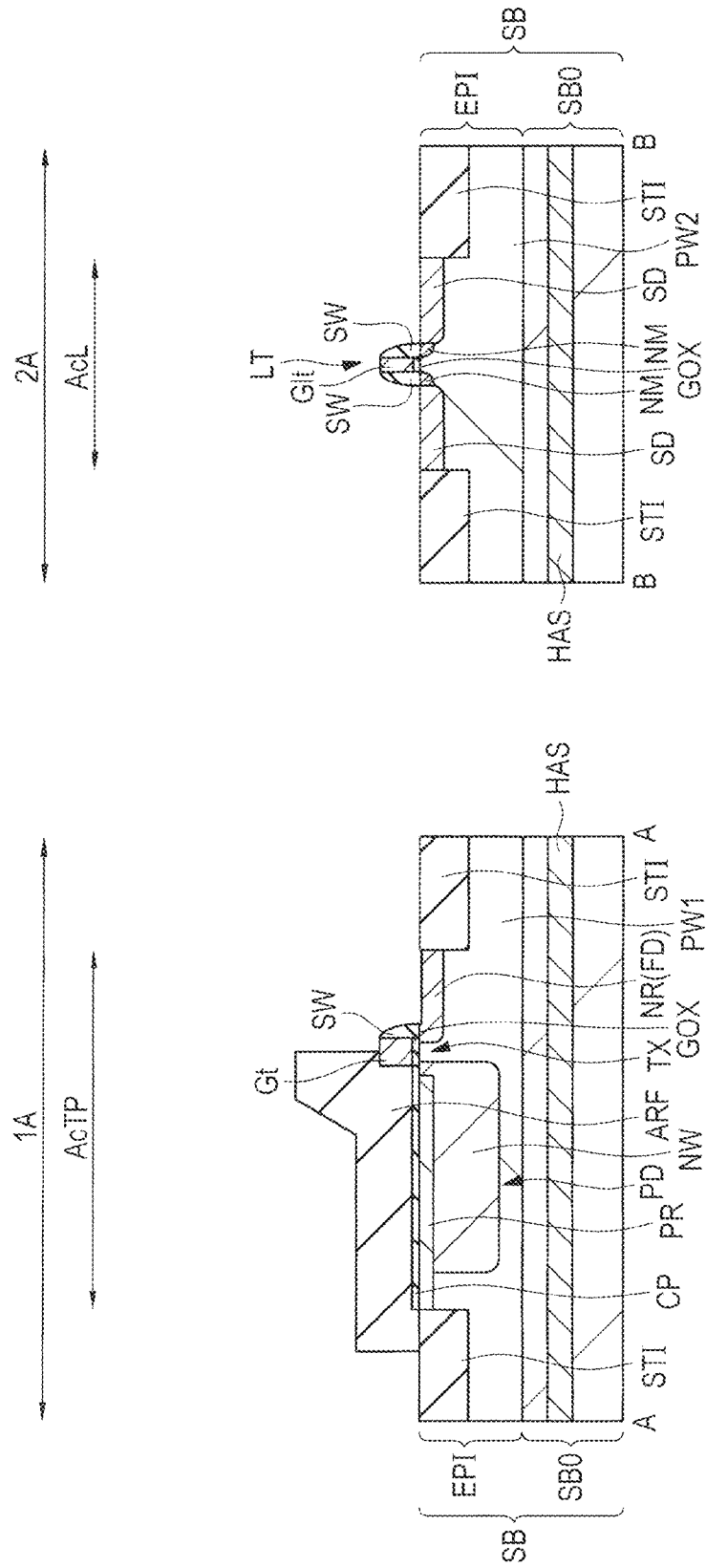
FIG. 17 is an essential part cross sectional view of the semiconductor device during the same manufacturing step as that of FIG. 16.

Then, the "semiconductor region NR forming impurity implantation" step (S12) and the "semiconductor region SD forming impurity implantation" step (S13) shown in FIG. 8 are carried out. As shown in FIG. 17, in the active region AcTP in the pixel region 1A, an impurity of phosphorus (P) or arsenic (As) is ion implanted into the semiconductor substrate SB (p type well region PW1) on the other side (drain side) of the opposite sides of the gate electrode Gt, thereby to form the n type semiconductor region NR. Incidentally, the drain side corresponds to the side opposite to the side on which the n type semiconductor region NW is formed.

In the ion implantation step of forming the n type semiconductor region NR, the antireflection film ARF and the gate electrode Gt can function as a mask (ion implantation inhibiting mask). This can prevent the implantation of the impurity in the region of the semiconductor substrate SB immediately under the antireflection film ARF and the gate electrode Gt. As a result, as shown in FIG. 17, in the portion of the semiconductor substrate SB (p type well region PW1) on the other side (drain side, namely, the side opposite to the side on which the n type semiconductor region NW is formed) of the opposite sides of the gate electrode Gt of the transfer transistor TX, the n type semiconductor region NR can be formed.

The n type semiconductor region NW and the n type semiconductor region NR are formed in such a manner as to be separated from each other across the channel forming region of the transfer transistor TX (corresponding to the substrate region immediately under the gate electrode Gt). The n type semiconductor region NR is an n type high density semiconductor region functioning as the drain region of the transfer transistor TX. The n type semiconductor region NR functions as the drain region of the transfer transistor TX, and can also be regarded as the floating diffusion (floating diffusion layer) FD.

Whereas, in the peripheral circuit region 2A, ions are implanted into the portions of the semiconductor substrate SB (p type well region PW2) on the opposite sides of the synthetic body of the gate electrode Glt and the sidewall spacers SW, thereby to form $n^+$ type semiconductor regions SD. During the ion implantation for forming the $n^+$ type semiconductor regions SD, the gate electrode Glt, and the sidewall spacers SW over the sidewalls thereof can function as a mask (ion implantation inhibiting mask). Accordingly, an n type impurity (phosphorus or arsenic) is ion implanted into the regions of the semiconductor substrate SB (p type well region PW2) on the opposite sides of the synthetic body of the gate electrode Glt and the sidewall spacers SW in the peripheral circuit region 2A. As a result, the $n^+$ type semiconductor regions SD are formed.

The $n^+$ type semiconductor region SD is a semiconductor region of the same conductivity type (herein, n type) as that of the $n^-$ type semiconductor region NM, and is higher in impurity density (n type impurity density), and deeper in depth (junction depth) than the $n^-$ type semiconductor region NM. As a result, in the peripheral circuit region 2A, the semiconductor region (source/drain region) functioning as source or drain of the peripheral transistor LT is formed by the $n^+$ type semiconductor region SD and the $n^-$ type semiconductor region NM. Therefore, the source/drain region of the peripheral transistor LT has a LDD structure.

Incidentally, the n type semiconductor region NR and the $n^+$ type semiconductor region SD can be formed by the same ion implantation step, but also can be formed by different ion implantations.

Whereas, by the steps equal to the formation steps of the n type semiconductor regions NR and the $n^+$ type semiconductor regions SD, for example, the source/drain regions of other transistors shown in FIG. 3, namely, the reset transistor RST, the selection transistor SEL, and the amplification transistor AMI can also be formed. The source/drain regions of the reset transistor RST, the selection transistor SEL, and the amplification transistor AMI can be formed by the same ion implantation steps equal to those of one or both of the n type semiconductor region NR and the $n^+$ type semiconductor region SD, but can also be formed by different ion implantation from that of the n type semiconductor region NR and the $n^+$ type semiconductor region SD.

Then, the "MISFET heat treatment" step (S14) shown in the FIG. 8 is carried out. The semiconductor substrate SB is subjected to a heat treatment, thereby to activate the ion-implanted semiconductor region NM forming impurity, semiconductor region NR forming impurity, and semiconductor region SD forming impurity. The heat treatment can be performed by, for example, laser annealing, microwave annealing, RTA (Rapid thermal annealing), or furnace annealing, or combinations thereof. The heat treatment temperature is set at about 1000° C. (900° C. or more). Simultaneously with the heat treatment step, the "termination process" is carried out.

By the steps up to this point, in the pixel region 1A of the semiconductor substrate SB, the photodiode PD, the transfer transistor TX, and other transistors not shown in the cross sectional view of FIG. 17, namely, the reset transistor RST, the selection transistor SEL, and the amplification transistor AMI are formed (see the FIG. 3). Whereas, in the peripheral circuit region 2A of the semiconductor substrate SB, the peripheral transistor LT as a MISFET is formed.

Figure 18:
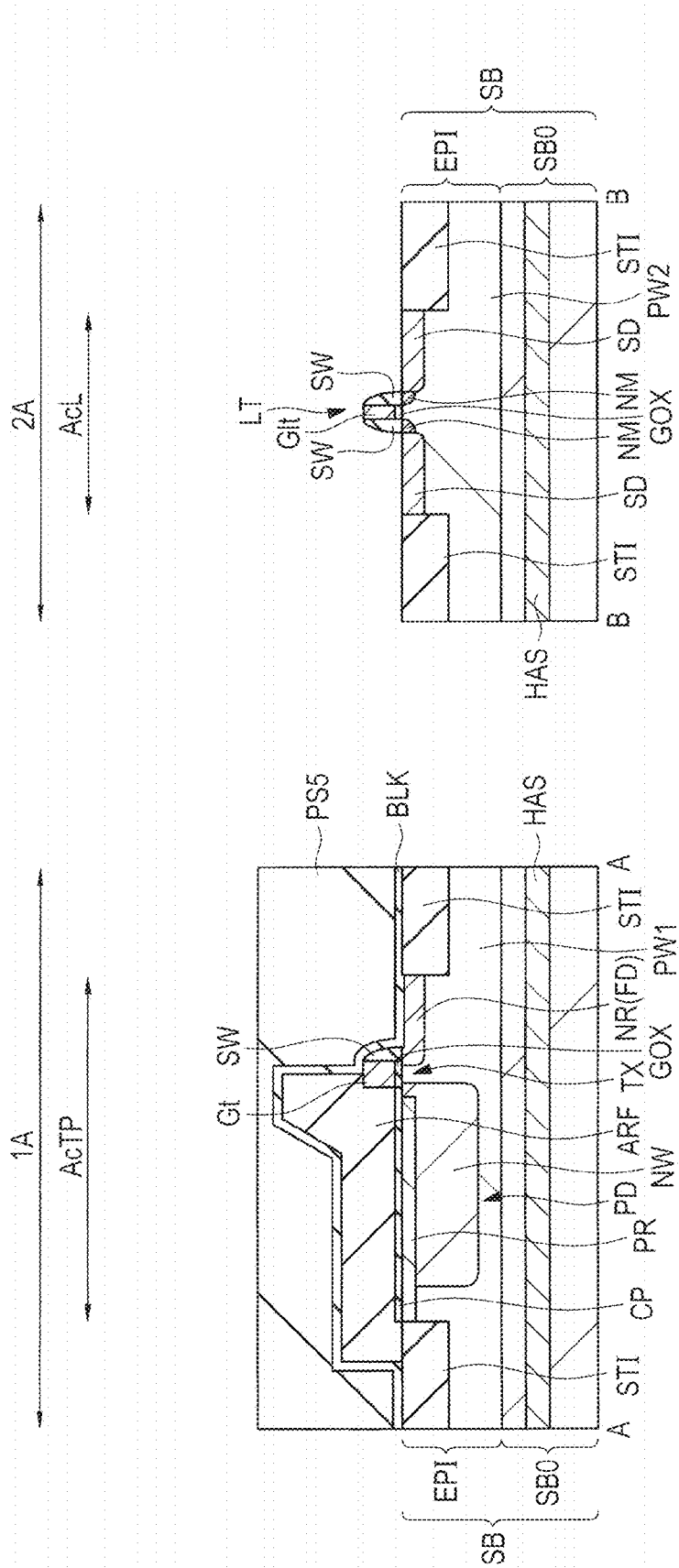
FIG. 18 is an essential part cross sectional view of the semiconductor device during a manufacturing step following FIG. 17.

Then, the "silicdie block film BLK formation" step (S15) shown in FIG. 8 is carried out. As shown in FIG. 18, over the main surface of the semiconductor substrate SB, a silicdie block film BLK formed of, for example, a silicon oxide film is formed. Then, a photoresist pattern RS5 having a pattern covering the pixel region 1A, and exposing the peripheral circuit region 2A is formed. The silicdie block film BLK is subjected to anisotropic dry etching using the photoresist pattern RS5 as a mask. Thus, the silicdie block film BLK is selectively left only in the pixel region 1A in such a manner as to cover at least the floating diffusion FD. Accordingly, in the peripheral circuit region 2A, the surfaces of the $n^+$ type semiconductor regions SD serving as the source/drain regions of the peripheral transistor LT, and the gate electrode Glt are exposed. Incidentally, the photoresist pattern RS5 is formed of the same material as that of the photoresist pattern RS4. The anisotropic dry etching conditions for the silicide block film BLK are the same as those for the anisotropic etching of the insulation film ZM. Thereafter, the photoresist pattern RS5 is removed.

Then, the "metal silicide layer SIL formation" step (S16) shown in FIG. 8 is carried out. As shown in FIG. 19, by a Salicide: Self Aligned Silicide technology, a step of forming a low-resistance metal silicide layer SIL at the top (front surface layer part) of the $n^+$ type semiconductor region SD, and the top (front surface layer part) of the gate electrode Glt, and the like is carried out.

The "metal silicide layer SIL formation" step (S16) includes, for example, a metal film formation step, a silicide layer SIL forming heat treatment step, and an unreacted metal film removing step. With the metal film formation step, a metal film such as a nickel (Ni) film, a titanium (Ti) film, a cobalt (Co) film, or a platinum (Pt) film, and an alloy film thereof are deposited over the semiconductor substrate SB. Then, the semiconductor substrate SB is subjected to a heat treatment. As a result, the metal film is allowed to react with the front surface layer portions of the type semiconductor region SD and the gate electrode Glt, thereby to form the silicide layers SIL. Then, the unreacted portions of the metal film are removed. As a result, the metal silicide layers SIL can be formed at the top (front surface layer part) of the $n^+$ type semiconductor region SD, the top (front surface layer part) of the gate electrode Glt, and the like. As the metal silicide layer forming metal film, a metal film such as a nickel (Ni) film, a titanium (Ti) film, a cobalt (Co) film, or a platinum (Pt) film, and an alloy film thereof can be used. When a titanium (Ti) film, or a cobalt (Co) film is used, the heat treatment is carried out at 850 to 900° C. For this reason, the "termination process" can be carried out simultaneously.

(S17) is carried out. As shown in FIG. 20, over the main surface (the entire main surface) of the semiconductor substrate SB, an interlayer insulation film IL1 and plug electrodes PG are formed. That is, the interlayer insulation film IL1 is formed over the semiconductor substrate SB in such a manner as to cover the gate electrodes Gt and Glt, the sidewall spacers SW, and the antireflection film ARF. As the interlayer insulation film IL1, a silicon oxide film can be deposited over the semiconductor substrate SB by a CVD method using, for example, a TEOS (tetra ethyl ortho silicate) gas as a raw material gas. Incidentally, in the pixel region 1A, the interlayer insulation film IL1 is formed over the silicdie block film BLK.

After the deposition of the interlayer insulation film IL1, the front surface (top surface) of the interlayer insulation film IL1 can also be polished by a CMP (Chemical Mechanical Polishing) method, thereby to planarize the top surface of the interlayer insulation film IL1. Even when, an uneven shape is formed in the surface of the interlayer insulation film IL1 due to the underlayer step difference at the stage of having deposited the interlayer insulation film IL1, the surface of the interlayer insulation film IL1 is polished by a CMP method after deposition. As a result, it is possible to obtain the interlayer insulation film IL1 with the planarized surface.

Then, using the photoresist pattern (not shown) formed over the interlayer insulation film IL1 as an etching mask, the interlayer insulation film IL1 is dry etched, thereby to form contact holes (through holes, holes, or openings) CT in the interlayer insulation film IL1.

The contact hole CT is formed in such a manner as to penetrate through the interlayer insulation film IL1. The contact hole CT is formed, for example, over the n type semiconductor region NR, or over the $n^+$ type semiconductor region SD. At the bottom of the contact hole CT formed over the n type semiconductor region NR, a part of the surface of the n type semiconductor region NR is exposed. Whereas, at the bottom of the contact hole CT formed over the $n^+$ type semiconductor region SD, a part of the metal silicide layer SIL formed at the surface of the $n^+$ type semiconductor region SD is exposed. Further, although not shown, the contact holes CT are also formed over the gate electrodes Gt and Glt, respectively. Further, the contact holes CT are also formed over respective gate electrodes (Gr, Gs, and Ga), and respective source/drain regions of the other transistors shown in FIG. 3, namely, the reset transistor RST, the selection transistor SEL, and the amplification transistor AMI, respectively.

Then, in the contact hole CT, as a conductor part for coupling, a conductive plug electrode PG formed of tungsten (W) or the like is formed. The plug electrode PG can be formed, for example, in the following manner.

For forming the plug electrode PG, first, over the interlayer insulation film IL1 including the inside (over the bottom surface and the inner wall) of the contact hole CT, a barrier conductor film is formed. The barrier conductor film is formed of, for example, a lamination film of a titanium film and a titanium nitride film formed over the titanium film (i.e., a titanium/titanium nitride film), and can be formed using a sputtering method or the like. Then, a main conductor film formed of a tungsten film or the like is formed over the barrier conductor film by a CVD method or the like in such a manner as to fill the contact hole CT. Then, the unnecessary portions of the main conductor film and the barrier conductor film outside the contact hole CT (over the interlayer insulation film IL1) are removed by a CMP method, an etch back method, or the like. As a result, the top surface of the interlayer insulation film IL1 is exposed. Thus, the plug electrode PG is formed of the barrier conductor film and main conductor film buried and left in the contact hole CT in the interlayer insulation film IL1. Incidentally, for simplification of the drawing, in FIG. 20, the barrier conductor film and the main conductor film forming the plug electrode PG are shown in an integral form.

Then, the "wires M1, M2, and M3 formation" step (S18) shown in FIG. 8 is carried out. As shown in FIG. 6, the step of forming interlayer insulation films IL2 to IL4, and wires M1 to M3 over the interlayer insulation film IL1 including the plug electrodes PG buried therein is carried out.

For example, over the interlayer insulation film IL1, as the interlayer insulation film IL2, a lamination film of a silicon nitride film and a silicon oxide film over the silicon nitride film is formed using a CVD method or the like. Then, a wiring trench is formed in the lamination film using a photolithography technology and a dry etching technology. Then, over the interlayer insulation film IL2 including the inside (over the bottom surface and the inner wall) of the wiring trench, a barrier conductor film is formed. The barrier conductor film is formed of, for example, a lamination film of a tantalum (Ta) film and a tantalum nitride (TaN) film over the tantalum film, and can be formed using a sputtering method or the like. Then, over the barrier conductor film, a thin copper film is deposited as a seed film by a sputtering method or the like. Then, by an electrolytic plating method, a copper plating film is deposited as a main conductor film over the seed film. The copper plating film fills the inside of the wiring trench. Then, unnecessary portions of the copper plating film, the seed film, and the barrier conductor film outside the wiring trench (over the interlayer insulation film IL2) are removed by a CMP method or the like. As a result, the first-layer wire M1 including copper as a main conductive material is formed in the wiring trench. Incidentally, in FIG. 6, the copper plating film forming the wire M1, the seed layer, and the barrier conductor film are shown in an integral form. Thus, by embedding the barrier film, the seed film, and the copper plating film in the inside of the wiring trench, the wire M1 can be formed.

Further, in the same manner, as shown in FIG. 6, over the interlayer insulation film IL2 including the wire M1 formed therein, an interlayer insulation film IL3 is formed. A wire M2 is formed in the interlayer insulation film IL3. Over the interlayer insulation film IL3 including the wire M2 formed therein, an interlayer insulation film IL4 is formed. A wire M3 is formed in the interlayer insulation film IL4. The wire M1 was formed by a single damascene method. However, the wire M2 and the wire M3 can be formed by a single damascene method or a dual damascene method.

Incidentally, in the interlayer insulation film IL3, a via part positioned between the wire M2 and the wire M1, and coupling the wire M2 and the were M1 is also formed. In the interlayer insulation film IL4, a via part positioned between the wire M3 and the wire M2, and coupling the wire M3 and the wire M2 is also formed. When the wire M2 is formed by a dual damascene method, the via part for coupling the wire M2 and the wire M1 is formed together with the wire M2, and integrally with the wire M2. Whereas, when the wire M2 is formed by a single damascene method, the via part for coupling the wire M2 and the wire M1 is formed separately from the wire M2. Similarly, when the wire M3 is formed by a dual damascene method, the via part for coupling the wire M3 and the wire M2 is formed together with the wire M3, and integrally with the wire M3. However, when the wire M3 is formed by a single damascene method, the via part for coupling the wire M3 and the wire M2 is formed separately from the wire M3.

Then, the "hydrogen sintering" step (S19) shown in FIG. 8 is performed. Hydrogen sintering is carried out in a hydrogen atmosphere at around 400° C. for dangling bond termination. Incidentally, in the case of the present embodiment, a large number of "termination processes" are carried out during manufacturing steps. For this reason, the "hydrogen sintering" step may be omitted.

Then, as shown in FIG. 6, over the uppermost-layer interlayer insulation film IL4, a microlens ML as an on-chip lens is mounted in such a manner as to overlap the n type semiconductor region NW forming the photodiode PD in a plan view. Incidentally, a color filter may be provided between the microlens ML and the interlayer insulation film IL4. Alternatively, if unnecessary, mounting of the microlens ML may be omitted.

By the steps up to this point, the semiconductor device of the present embodiment can be manufactured.

Incidentally, in FIGS. 7 and 8, the step surrounded by a doublet indicates that the step includes a "termination process".

Regarding the Main Feature and Effects of the Present Embodiment

In accordance with the present embodiment, after carrying out the hydrogen adsorption site HAS formation step (S2), a photodiode PD manufacturing step is carried out. The photodiode PD manufacturing step includes a step including a "termination process". For this reason, the interface level can be sufficiently reduced. This can reduce the dark-time white spots and the dark current of a CMOS image sensor having the photodiode PD.

Further, after carrying out the hydrogen adsorption site HAS formation step (S2), the manufacturing steps of the transfer transistor TX or the peripheral transistor LT are carried out. The manufacturing steps of the transfer transistor TX or the peripheral transistor LT include a large number of steps including the "termination process". For this reason, the interface level can be sufficiently reduced. This can improve the electric characteristics of the transfer transistor TX or the peripheral transistor LT.

Further, the hydrogen adsorption site HAS formation step (S2) is carried out before the element isolation film STI formation" step (S3). As a result, in all the manufacturing steps involving high temperatures of 600° C. or more, the "termination process" can be carried out. This can improve the electric characteristics and performances of a semiconductor device having the photodiode PD, the transfer transistor TX or the peripheral transistor LT.

Whereas, the hydrogen released from the hydrogen adsorption site HAS is finally released to outside the substrate as stable $H_2$, but may be diffused in the substrate as H ions or H radicals during the elimination process from the hydrogen adsorption site. The active hydrogen can carry out the termination of the dangling bond more efficiently. Further, for the occlusion of hydrogen at the hydrogen adsorption site, it is considered that $H_2$ in the atmosphere is adsorbed by dissociative occlusion at the hydrogen adsorption site.

Second Embodiment

In the First Embodiment, a description has been given to the the front surface irradiation type image sensor in which the semiconductor device receives a light from the front surface side of the semiconductor substrate. On the other hand, in the present Second Embodiment, a description will be given to an example of a back surface irradiation type image sensor in which the semiconductor device receives light from the back surface side of the semiconductor substrate.

For example, with the front surface irradiation type image sensor (corresponding to the semiconductor device of First Embodiment), the light incident upon the microlens (ML) passes through the interlayer insulation films (IL1 to IL4), to be applied to the photodiode (PD). At the portions of the interlayer insulation films (IL1 to IL4) situated above the photodiode (PD), the wires (M1 to M3) are not formed, and the portions become a light passing region. With an increase in number of pixels, and a size reduction of the image sensor, the area of the light passing region is decreased. Accordingly, with the front surface irradiation type image sensor, the amount of light to be incident upon the photodiode may be decreased.

Under such circumstances, a back surface irradiation type image sensor is proposed in which light is made incident from the back surface side of the semiconductor substrate, and the incident light is allowed to reach the photodiode with efficiency. In the present Second Embodiment, an example applied to the back surface irradiation type image sensor will be described.

The configuration of the semiconductor device of the present Second Embodiment, and the element structure of the peripheral circuit region thereof are the same as the configuration of the semiconductor device of First Embodiment, and the element structure of the peripheral circuit region thereof described by reference to FIGS. 1 to 6, and hence, will not be described.

Element Structure of Pixel Region

Figure 25:
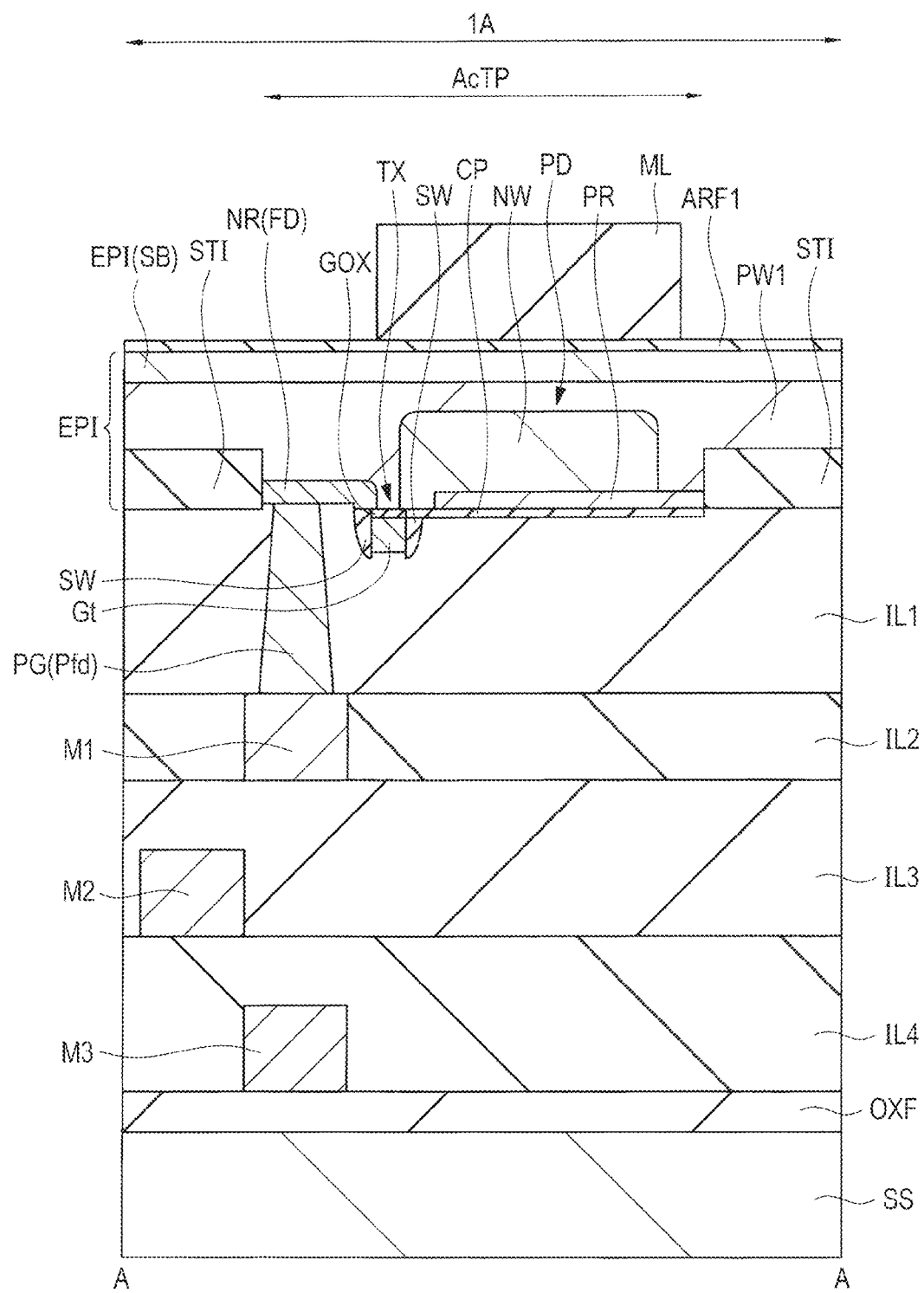
FIG. 25 is an essential part cross sectional view of the semiconductor device during the same manufacturing step as that of FIG. 24.

Then, a description will be given to the element structure of the pixel region of the semiconductor device of the present Second Embodiment. FIG. 25 is an essential part cross sectional view of the the semiconductor device of the present Second Embodiment, roughly corresponds to the cross sectional view along line A-A of FIG. 3, and corresponds to FIG. 6 of the First Embodiment. Incidentally, FIG. 25 is also an essential part cross sectional view in the method for manufacturing the semiconductor device of Second Embodiment described later.

Figure 23:
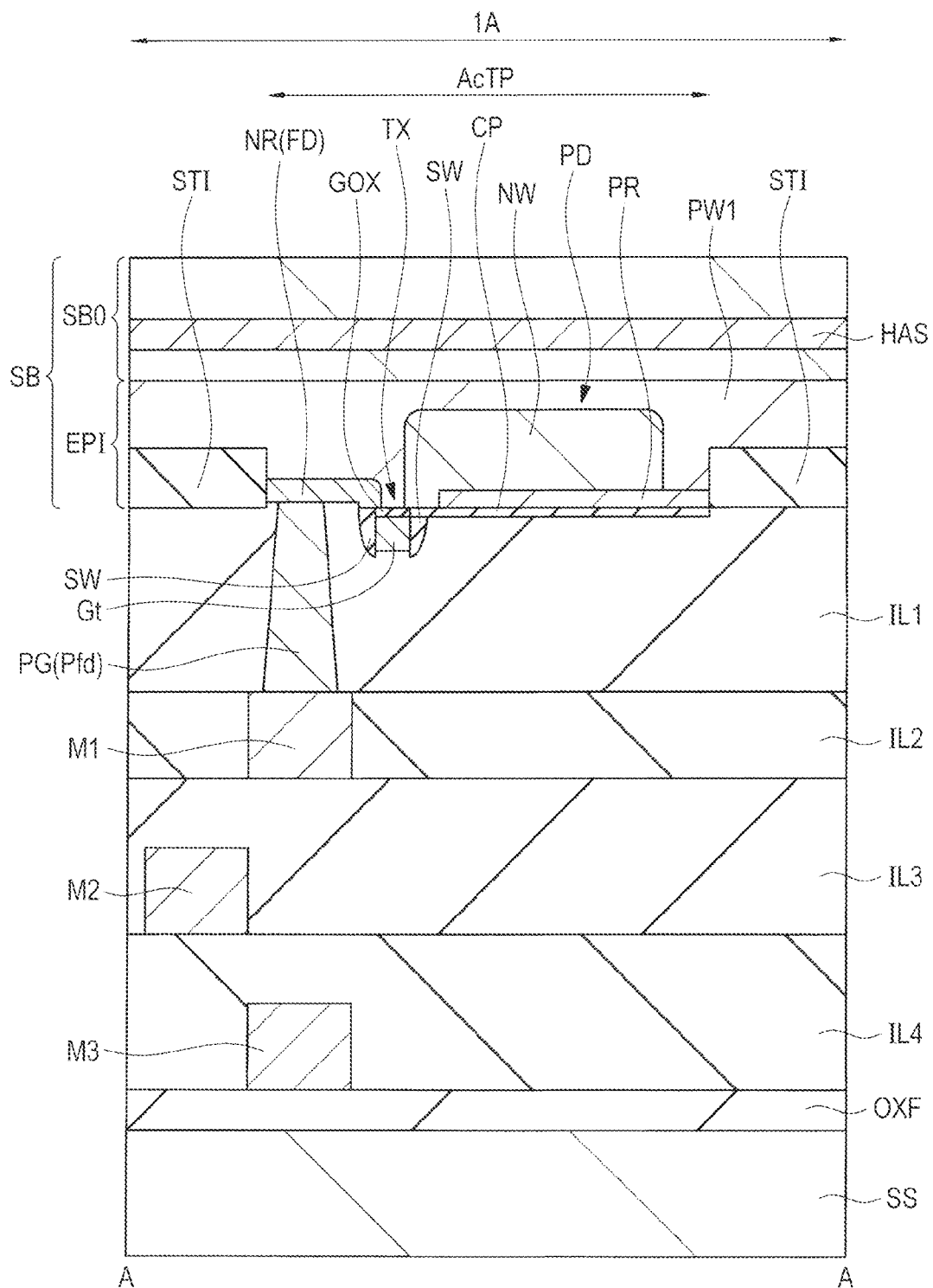
FIG. 23 is an essential part cross sectional view of a semiconductor device of Second Embodiment during a manufacturing step.

As shown in FIG. 23, the photodiode PD and the transfer transistor TX are formed at the semiconductor substrate SB. In addition, on the front surface side (corresponding to the lower side in FIG. 25) of the semiconductor substrate SB, the interlayer insulation films (IL1 to IL4), and wiring layers (M1 to M3) are formed. In these regards, the present Second Embodiment is also the same as the First Embodiment. Then, further, in the present Second Embodiment, as shown in FIG. 25, a contact film OXF is formed at a layer underlying the interlayer insulation film (IL4). A support substrate SS is arranged at a layer underlying the contact film OXF.

Further, in the present Second Embodiment, the thickness of the semiconductor substrate SB is smaller than the thickness of the semiconductor substrate SB in the First Embodiment. In addition, at the back surface (corresponding to the surface on the upper side in FIG. 25) of the semiconductor substrate SB, an antireflection film ARF1 formed of, for example, a silicon oxynitride film is formed. Over the antireflection film ARF1, the microlens ML is mounted. Incidentally, a $p^+$ type semiconductor region may be formed between the semiconductor substrate SB and the antireflection film ARF1.

In the pixel region 1A thus configured, when a light is made incident upon the microlens ML, the light incident upon the microlens ML reaches the back surface of the semiconductor substrate SB through the antireflection film ARF1. Then, the light which has reached the back surface of the semiconductor substrate SB penetrates the inside of the semiconductor substrate SB, to be applied to the photodiode PD.

Method for Manufacturing Semiconductor Device

Figure 24:
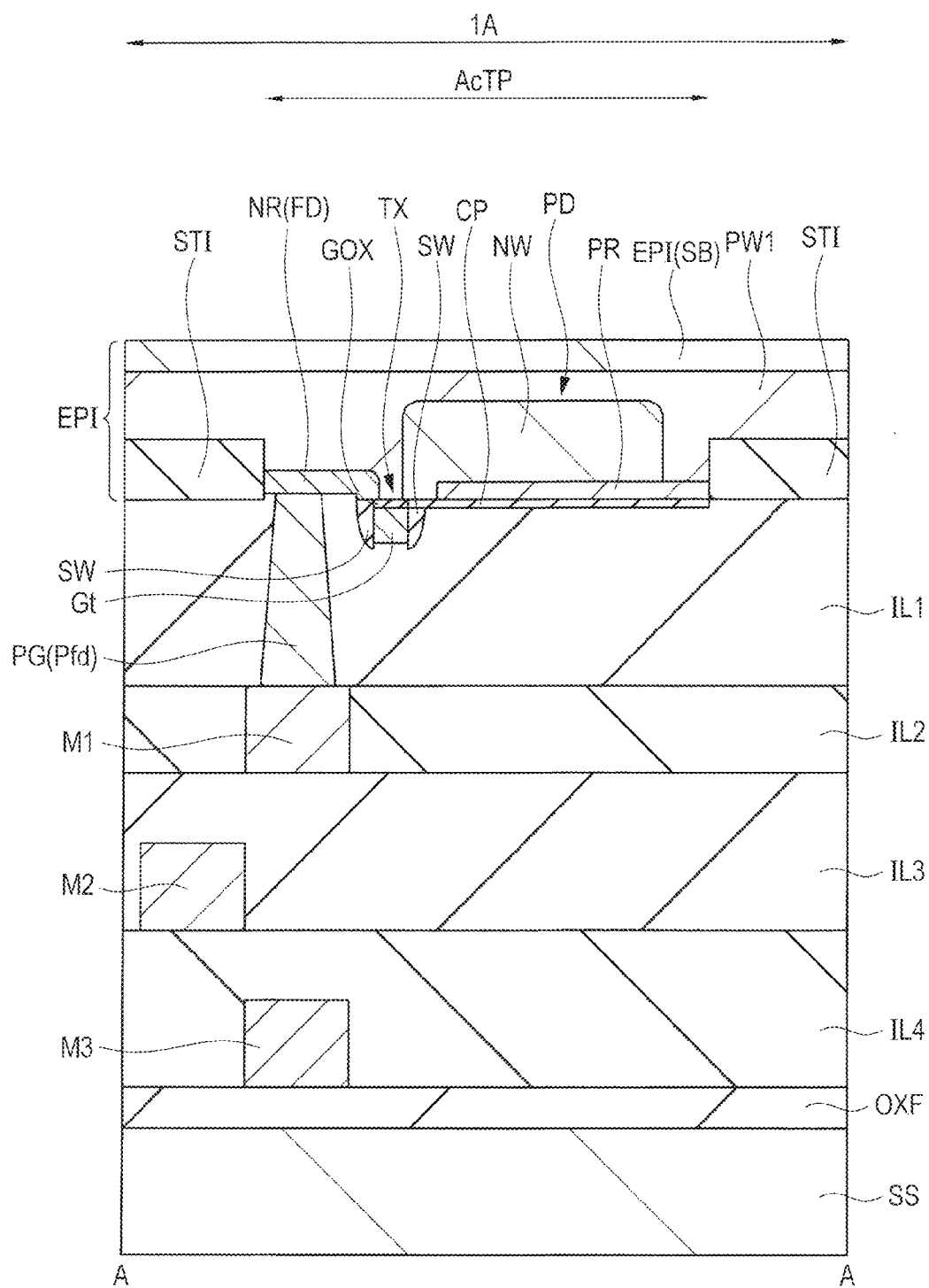
FIG. 24 is an essential part cross sectional view of the semiconductor device during a manufacturing step following FIG. 23.

Then, the method for manufacturing the semiconductor device of the present Second Embodiment will be described. Incidentally, below, the manufacturing steps in the pixel region will be described. FIGS. 23 to 25 are each an essential part cross sectional view of the semiconductor device of Second Embodiment during a manufacturing step. Incidentally, FIGS. 23 to 25 are each a cross sectional view at a position corresponding to the line A-A of FIG. 3.

First, the present Second Embodiment is different from First Embodiment in that the antireflection film ARF1 is not formed on the main surface side of the semiconductor substrate SB, but formed on the back surface side of the semiconductor substrate SB. The method for manufacturing a semiconductor device of Second Embodiment is almost the same up to the completion of the semiconductor device shown in FIG. 6, and hence only different parts will be described.

In the step of forming the antireflection film ARF and the sidewall spacer SW described by reference to FIG. 16, with the insulation film ZM covered with the photoresist pattern RS4, the insulation film ZM was subjected to anisotropic etching. However, in Second Embodiment, without forming the photoresist pattern RS4, the insulation film ZM is subjected to anisotropic etching. As a result, as shown in FIG. 23, sidewall spacers SW are formed on respective sidewalls on the opposite sides of the gate electrode Gt. Other steps are the same as in First Embodiment.

Then, as shown in FIG. 24, the surface of the interlayer insulation film IL4 including the wire M3 formed therein is set to point downward. At the surface of the interlayer insulation film IL4, a support substrate SS is arranged via a contact film OXF formed of, for example, a silicon oxide film. As a result, with the back surface of the semiconductor substrate SB pointing upwards, the semiconductor substrate SB, and a lamination body including the insulation films IL1 to 1L4 are fixed to the support substrate SS. Then, as shown in FIG. 24, the upward-pointing back surface of the semiconductor substrate SB is polished. As a result, the thickness of the semiconductor substrate SB can be reduced.

Then, as shown in FIG. 25, over the back surface of the semiconductor substrate SB, an antireflection film ARF1 formed of, for example, a silicon oxynitride film is formed. Incidentally, using a photolithography technology and an ion implantation method, the upper surface side-pointing back surface of the semiconductor substrate SB may be doped with a p type impurity such as boron (B), thereby to form a $p^+$ type semiconductor region between the semiconductor substrate SB and the antireflection film ARF1.

Then, as shown in FIG. 25, over the antireflection film ARF1, a microlens ML is mounted in such a manner as to overlap the n type semiconductor region NW forming the photodiode PD in a plan view. In the manner up to this point, the semiconductor device as an image sensor in the present Second Embodiment can be manufactured.

The present Second Embodiment is also the same in terms of the formation method of the photodiode PD or the transistors as the First Embodiment. For this reason, the present Second Embodiment can also provide the same effects as those described in the First Embodiment.

Third Embodiment

Figure 34:
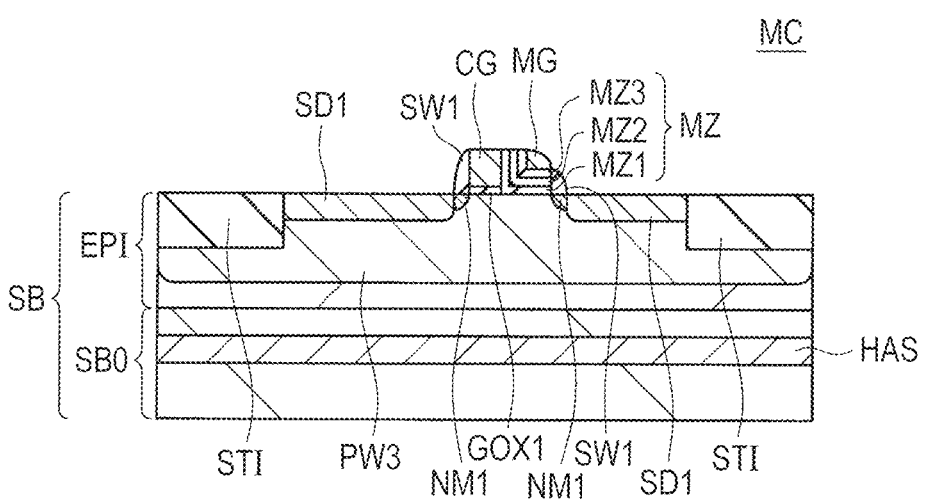
FIG. 34 is an essential part cross sectional view of the semiconductor device during a manufacturing step following FIG. 33.

In the present Third Embodiment, a description will be given to an example in which the semiconductor device is a nonvolatile semiconductor memory device. The nonvolatile semiconductor memory device has a plurality of memory cells MC. As shown in FIG. 34, the memory cell MC has a control gate electrode CG formed over the semiconductor substrate SB via a gate insulation film GOX1, a memory gate electrode MG formed over the semiconductor substrate SB via a gate insulation film MZ, and semiconductor regions NM1 and SD1 formed in the surface of the semiconductor substrate SB in such a manner as to interpose the control gate electrode CG and the memory gate electrode MG therebetween.

Figure 26:
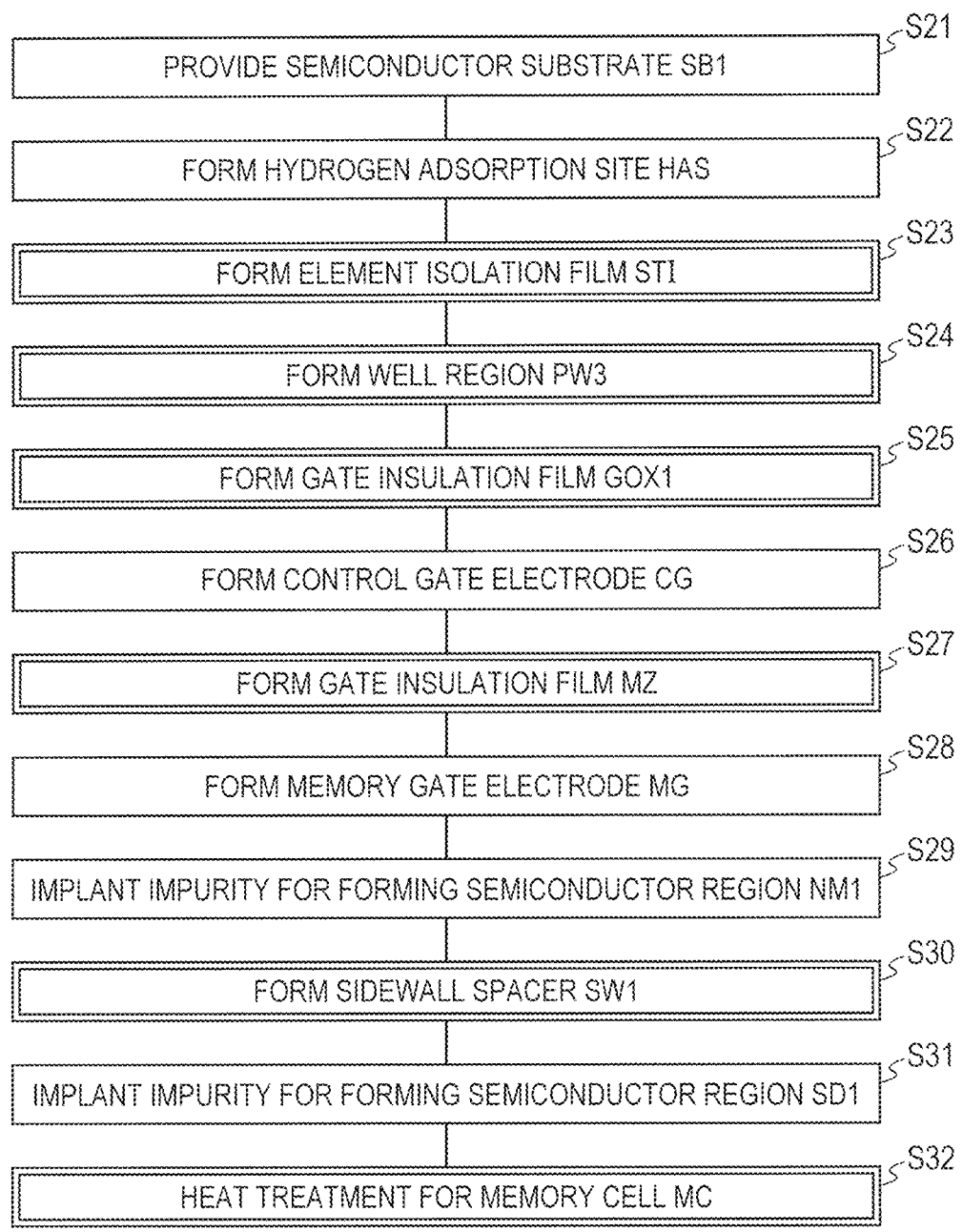
FIG. 26 is a process flowchart showing some of the manufacturing steps of a semiconductor device of Third Embodiment.

Below, by reference to FIGS. 26 to 34, a method for manufacturing a semiconductor device of the present embodiment will be described. FIG. 26 is a process flowchart showing some of the manufacturing steps of the semiconductor device of the present embodiment. Incidentally, the step surrounded by a doublet in FIG. 26 indicates that the step includes a "termination process". FIGS. 27 to 34 are each an essential part cross sectional view of the semiconductor device of the present embodiment (particularly, the memory cell MC portion) during a manufacturing step.

Figure 27:
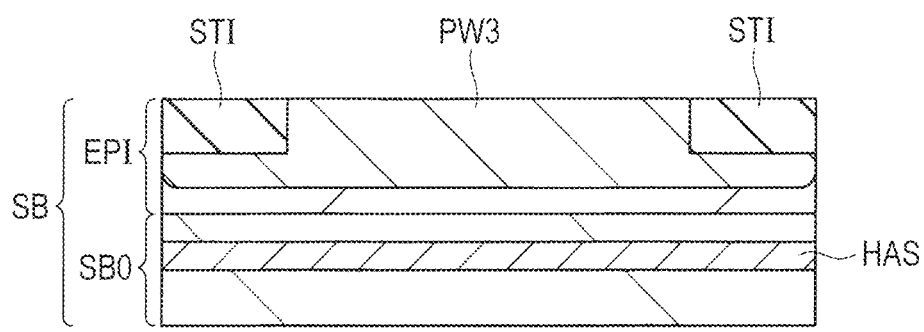
FIG. 27 is a process flowchart showing others of the manufacturing steps of the semiconductor device of Third Embodiment.

The step (S21) to step (S24) shown in FIG. 26 are the same as the step (S1) to step (S4) shown in FIG. 7, and hence will not be described. FIG. 27 shows an essential part cross sectional view during a manufacturing step after completion of the steps up to step (S24). In the present embodiment, the well region is given a reference sign and numeral "PW3".

Figure 28:
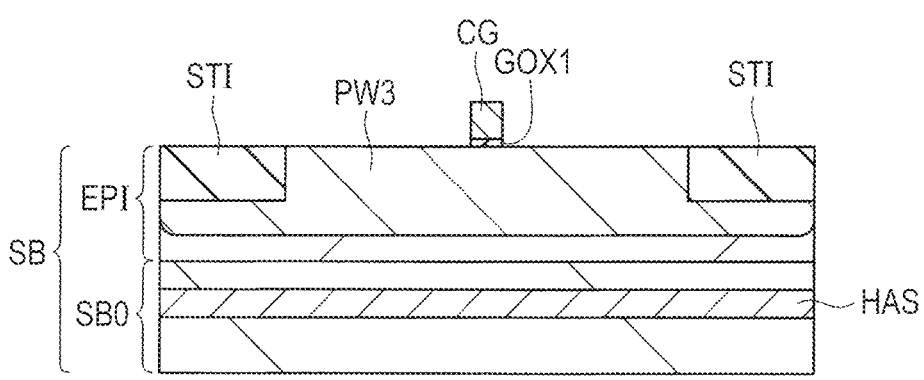
FIG. 28 is an essential part cross sectional view of the semiconductor device during a manufacturing step following FIG. 27.

Then, the "gate insulation film GOX1 formation" step (S25) and the "control gate electrode CG formation" step (S26) shown in FIG. 26 are carried out. As shown in FIG. 28, over the semiconductor substrate SB (p type well region PW3), the gate insulation film GOX1 and the control gate electrode CG are formed. The formation method of the gate insulation film GOX1 and the control gate electrode CG is the same as the formation method of the gate insulation film GOX and the gate electrode Gt of First Embodiment. In other words, the "gate insulation film GOX1 formation" step (S25) includes the "termination process".

Figure 29:
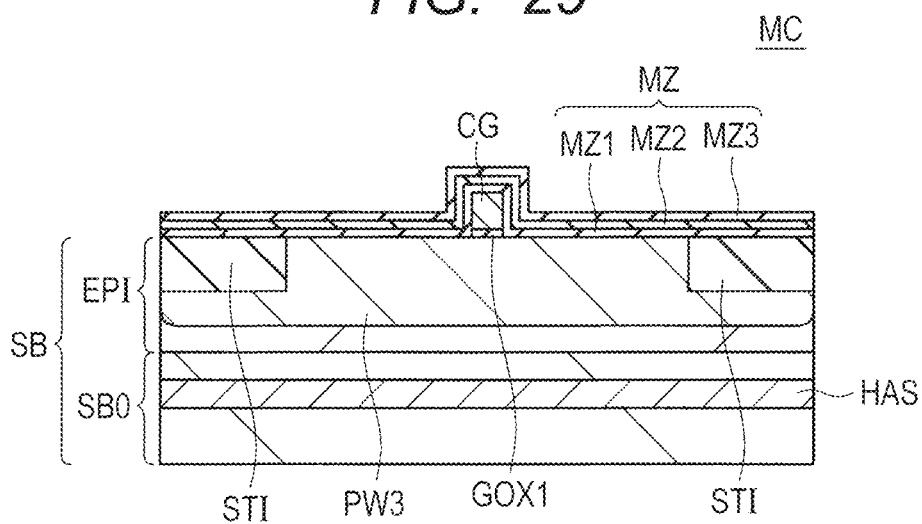
FIG. 29 is an essential part cross sectional view of the semiconductor device during a manufacturing step following FIG. 28.

Then, the "gate insulation film MZ formation" step (S27) and the "memory gate electrode MG formation" step (S28) shown in FIG. 26 are carried out. As shown in FIG. 29, in order to form the gate insulation film MZ, insulation films MZ1, MZ2, and MZ3 are sequentially formed in such a manner as to cover the top surface and the side surface of the control gate electrode CG. The insulation films MZ1, MZ2, and MZ3 are formed of a silicon oxide film, a silicon nitride film, and a silicon oxide film, respectively. The insulation film MZ1 is formed of a silicon oxide film, and is formed by a thermal oxidation method, an ISSG oxidation method, or the like at temperatures of, for example, about 1000 to 1100° C. The insulation film MZ2 is formed of a silicon nitride film, and is formed by a CVD method. The insulation film MZ3 is formed of a silicon oxide film, and is formed by a CVD method. Incidentally, the formation step of the insulation film MZ1 includes a "termination process".

Figure 30:
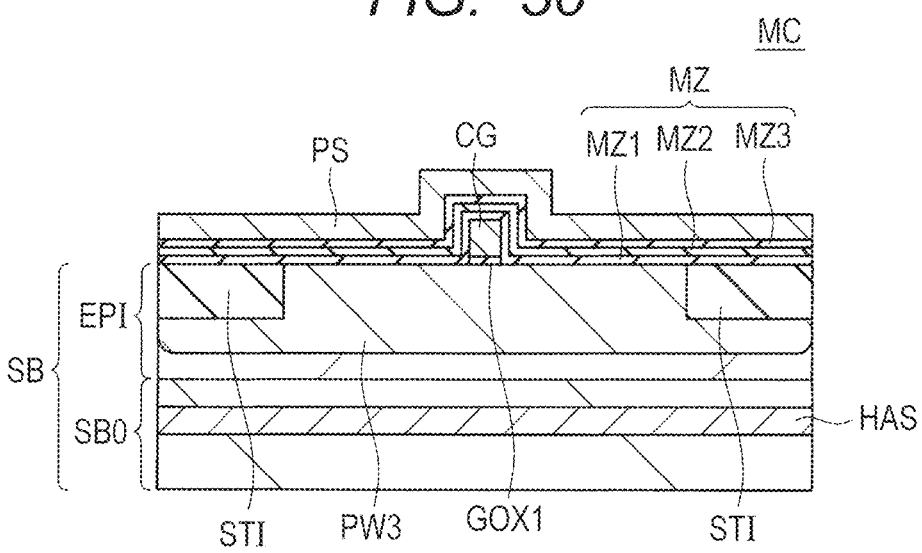
FIG. 30 is an essential part cross sectional view of the semiconductor device during a manufacturing step following FIG. 29.

Then, as shown in FIG. 30, over the insulation film MZ3, a conductor film PS formed of a polysilicon film or the like is formed. As the conductor film PS, for example, the one reduced in resistivity by being doped with an n type impurity such as phosphorus (P) or arsenic (As), or a p type impurity such as boron (B) is preferably used.

Figure 31:
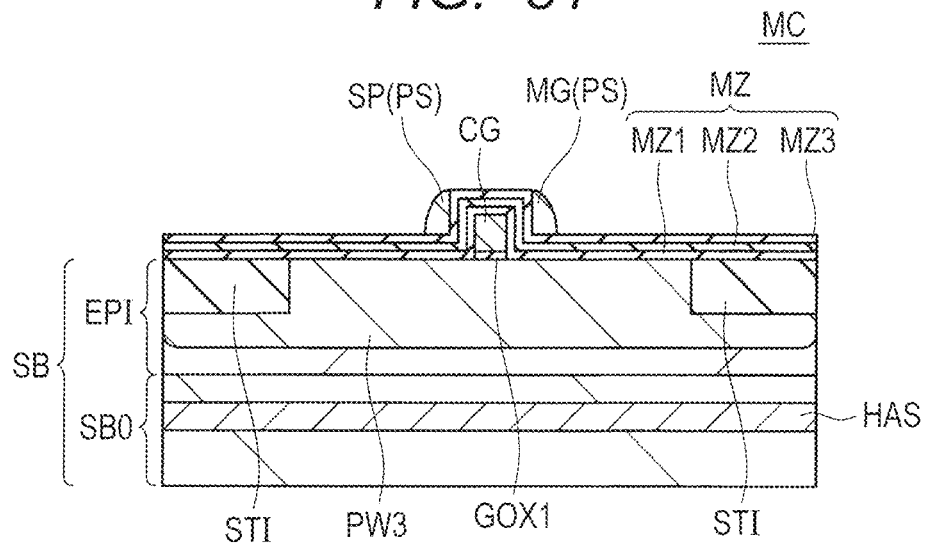
FIG. 31 is an essential part cross sectional view of the semiconductor device during a manufacturing step following FIG. 30.

Then, as shown in FIG. 31, by an anisotropic dry etching technology, the conductor film PS is etched back, thereby to form the memory gate electrode MG and the spacer SP. The memory gate electrode MG formed of the conductor film PS left in a sidewall spacer form is formed over the sidewall on a first side, namely, on the side on which the memory gate electrode MG adjacent to the control gate electrode CG is arranged, of the sidewalls on the opposite sides of the control gate electrode CG via the insulation films MZ1, MZ2, and MZ3. Whereas, the spacer PS formed of the conductor film PS left in a sidewall spacer form is formed over the sidewall opposite to the first side, namely, on the side opposite to the side on which the memory gate electrode MG adjacent to the control gate electrode CG is arranged, of the sidewalls on the opposite sides of the control gate electrode CG via the insulation films MZ1, MZ2, and MZ3.

Figure 32:
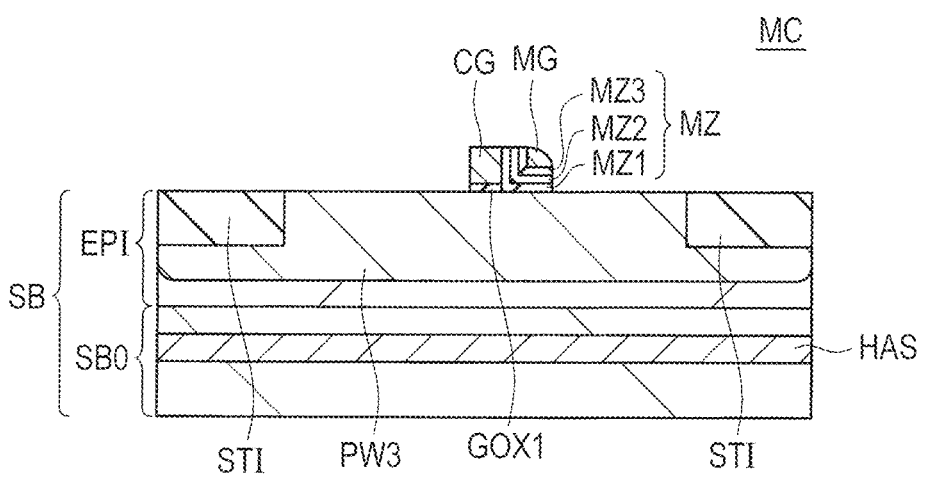
FIG. 32 is an essential part cross sectional view of the semiconductor device during a manufacturing step following FIG. 31.

Then, as shown in FIG. 32, the spacer SP, and the insulation films MZ1, MZ2, and MZ3 are removed. First, using photolithography, such a resist pattern (not shown) as to cover the memory gate electrode MG, and to expose the spacer SP is formed over the semiconductor substrate SB. Then, by dry etching using the formed resist pattern as an etching mask, the spacer SP is removed. On the other hand, the memory gate electrode MG was covered with the resist pattern, and hence is left without being etched. Then, the resist pattern is removed. Then, the portions of the insulation films MZ1, MZ2, and MZ3 not covered with the memory gate electrode MG are removed by etching such as wet etching. Thus, the gate insulation film MZ situated between the memory gate electrode MG and the p type well PW3, and between the memory gate electrode MG and the control gate electrode CG is formed. The gate insulation film MZ includes a lamination structure of the insulation films MZ1, MZ2, and MZ3. The insulation film MZ2 has an electrical charge holding function.

Figure 33:
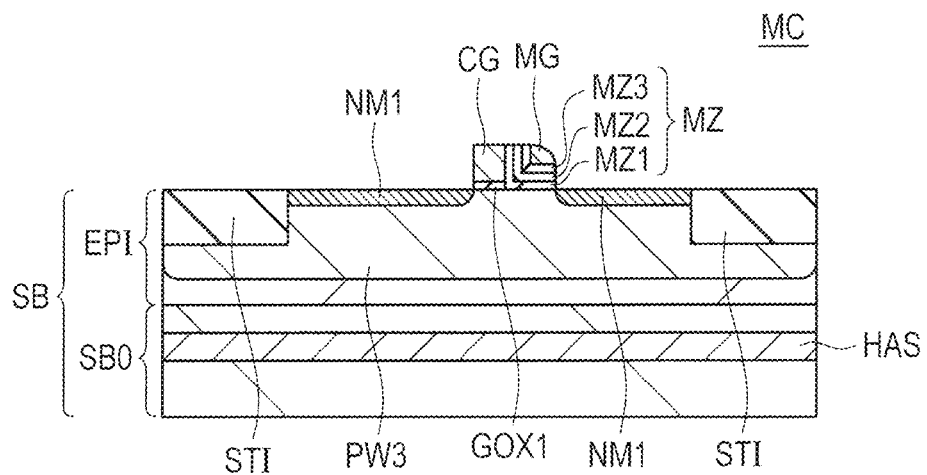
FIG. 33 is an essential part cross sectional view of the semiconductor device during a manufacturing step following FIG. 32.

Then, the "semiconductor region NM1 forming impurity implantation" step (S29) shown in FIG. 26 is carried out. An n type impurity such as arsenic (As) or phosphorus (P) is doped into the p type well region PW3 of the semiconductor substrate SB using the control gate electrode CG, the memory gate electrode MG, and the element isolation film STI as a mask. As a result, as shown in FIG. 33, $n^-$ type semiconductor regions NM1 are formed in such a manner as to interpose the control gate electrode CG and the memory gate electrode MG therebetween.

Then, the "sidewall spacer SW1 formation" step (S30) shown in FIG. 26 is carried out. Over the semiconductor substrate SB, an insulation film for sidewall spacer SW is formed. The insulation film is etched back by, for example, anisotropic etching. As shown in FIG. 34, the insulation film is selectively left over the sidewall of the control gate electrode CG, and over the sidewall of the memory gate electrode MG, thereby to form sidewall spacers SW1. The sidewall spacers SW1 are each formed of an insulation film such as a silicon oxide film or a silicon nitride film, or a lamination film thereof.

Then, the "semiconductor region SD1 forming impurity implantation" step (S31) shown in FIG. 26 is carried out. An n type impurity such as arsenic (As) or phosphorus (P) is doped into the p type well region PW3 of the semiconductor substrate SB using the control gate electrode CG, the memory gate electrode MG, the sidewall spacers SW1, and the element isolation film STI as a mask. As a result, as shown in FIG. 34, $n^+$ type semiconductor regions SD1 are formed in such a manner as to interpose the control gate electrode CG and the memory gate electrode MG therebetween.

Then, the "memory cell MC heat treatment" step (S32) shown in FIG. 26 is carried out. The semiconductor substrate SB is subjected to a heat treatment, thereby to activate an ion-implanted semiconductor region NM1 forming impurity and a semiconductor region SD1 forming impurity. The heat treatment can be carried out in the same manner as in First Embodiment. The heat treatment step includes a "termination process".

As with the First Embodiment, after carrying out the wire formation step, a hydrogen sintering step can also be carried out.

In accordance with the present embodiment, after carrying out the hydrogen adsorption site HAS formation step (S22), the manufacturing steps of the memory cell MC are carried out. The manufacturing steps of the memory cell MC include a large number of steps including the termination process". For this reason, the interface level can be sufficiently reduced. This can improve the write, erase, and read characteristics of the memory cell MC.

Up to this point, the invention completed by the present inventors was specifically described by way of embodiments thereof. However, it is naturally understood that the present invention is not limited to the embodiments, and may be variously changed within the scope not departing from the gist thereof.

What is claimed is:

1. A method for manufacturing a semiconductor device, comprising the steps of:
    (a) providing a semiconductor substrate having a gettering layer formed by ion implanting a cluster in the inside thereof, and an epitaxial layer formed at the top of the gettering layer;
    (b) subjecting the semiconductor substrate to a first heat treatment at 800° C. or more;
    (c) after the step (b), forming an element isolation film, and an active region surrounded by the element isolation film at the main surface of the semiconductor substrate;
    (d) implanting a first impurity of a first conductivity type into the semiconductor substrate in the active region;
    (e) implanting a second impurity of a second conductivity type different from the first conductivity type into the semiconductor substrate in the active region; and
    (f) after the steps (d) and (e), subjecting the semiconductor substrate to a second heat treatment at 600° C. or more.

2. The method for manufacturing a semiconductor device according to claim 1,
    wherein the cluster includes carbon and hydrogen.

3. The method for manufacturing a semiconductor device according to claim 1,
    wherein in the step (f), the second heat treatment is carried out at 900° C. or more for activating the first impurity and the second impurity.

4. The method for manufacturing a semiconductor device according to claim 1,
    wherein in the step (b), a hydrogen adsorption layer capable of adsorbing hydrogen is formed in the gettering layer.

5. The method for manufacturing a semiconductor device according to claim 4,
    wherein in the step (f), the dangling bond of the semiconductor substrate is terminated with the hydrogen desorbed from the hydrogen adsorption layer.

6. A method for manufacturing a semiconductor device, comprising the steps of:
    (a) providing a semiconductor substrate having a gettering layer formed by ion implanting a cluster in the inside thereof, and an epitaxial layer formed at the top of the gettering layer;
    (b) subjecting the semiconductor substrate to a first heat treatment at 800° C. or more;
    (c) after the step (b), forming an element isolation film, and an active region surrounded by the element isolation film at the main surface of the semiconductor substrate;
    (d) forming a gate electrode over the main surface of the semiconductor substrate via a first insulation film in the active region;
    (e) implanting an impurity into the opposite ends of the gate electrode in the active region; and
    (f) after the step (e), subjecting the semiconductor substrate to a second heat treatment at 600° C. or more.

7. The method for manufacturing a semiconductor device according to claim 6,
    wherein the cluster includes carbon and hydrogen.

8. The method for manufacturing a semiconductor device according to claim 6,
    wherein in the step (f), the second heat treatment is carried out at 900° C. or more for activating the impurity.

9. The method for manufacturing a semiconductor device according to claim 6,
    wherein in the step (b), a hydrogen adsorption layer capable of adsorbing hydrogen is formed in the gettering layer.

10. The method for manufacturing a semiconductor device according to claim 9,
    wherein in the step (f), the dangling bond of the semiconductor substrate is terminated with the hydrogen desorbed from the hydrogen adsorption layer.

11. A method for manufacturing a semiconductor device, comprising the steps of:
    (a) providing a semiconductor substrate having a gettering layer formed by ion implanting a cluster in the inside thereof, and an epitaxial layer formed at the top of the gettering layer;
    (b) subjecting the semiconductor substrate to a first heat treatment at 800° C. or more;
    (c) after the step (b), forming an element isolation film, and an active region surrounded by the element isolation film at the main surface of the semiconductor substrate;
    (d) forming a first gate electrode over the main surface of the semiconductor substrate via a first insulation film in the active region;
    (e) forming a second gate electrode over the main surface of the semiconductor substrate via a second insulation film in the active region;
    (f) implanting an impurity into the main surface of the semiconductor substrate in such a manner as to interpose the first gate electrode and the second gate electrode; and
    (g) after the step (f), subjecting the semiconductor substrate to a second heat treatment at 600° C. or more.

12. The method for manufacturing a semiconductor device according to claim 11,
    wherein the formation step of the second insulation film of the step (e), includes the steps of:
    (e-1) forming a silicon oxide film at the main surface of the semiconductor substrate; and
    (e-2) forming a silicon nitride film over the silicon oxide film.

13. The method for manufacturing a semiconductor device according to claim 11,
    wherein the second gate electrode is formed over the sidewall of the first gate electrode.

14. The method for manufacturing a semiconductor device according to claim 11,
    wherein the cluster includes carbon and hydrogen.

15. The method for manufacturing a semiconductor device according to claim 11,
    wherein in the step (g), the second heat treatment is carried out at 900° C. or more for activating the impurity.

* * * * *